US008674426B2

(12) United States Patent
Higuchi et al.

(10) Patent No.: US 8,674,426 B2
(45) Date of Patent: Mar. 18, 2014

(54) NONVOLATILE SEMICONDUCTOR MEMORY DEVICE

(75) Inventors: Masaaki Higuchi, Mie-ken (JP); Yoshio Ozawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 322 days.

(21) Appl. No.: 13/023,025

(22) Filed: Feb. 8, 2011

(65) Prior Publication Data

US 2011/0193153 A1 Aug. 11, 2011

(30) Foreign Application Priority Data

Feb. 8, 2010 (JP) ................................ 2010-025530

(51) Int. Cl.
*H01L 29/788* (2006.01)

(52) U.S. Cl.
USPC ........... 257/316; 257/317; 257/331; 438/156; 438/268

(58) Field of Classification Search
USPC .......... 257/316, 324, 326, 331, 390; 438/269, 438/294, 587
See application file for complete search history.

(56) References Cited

U.S. PATENT DOCUMENTS

| 2002/0195668 A1* | 12/2002 | Endoh et al. .................. 257/390 |
| 2008/0073635 A1 | 3/2008 | Kiyotoshi et al. |
| 2010/0207195 A1 | 8/2010 | Fukuzumi et al. |

FOREIGN PATENT DOCUMENTS

| EP | 1507294 A2 * | 2/2005 | ............ H01L 29/786 |
| JP | 2006-511089 | 3/2006 | |
| JP | 2009-146954 | 7/2009 | |

* cited by examiner

*Primary Examiner* — Kimberly Rizkallah
*Assistant Examiner* — Errol Fernandes
(74) *Attorney, Agent, or Firm* — Oblon, Spivak, McClelland, Maier & Neustadt, L.L.P.

(57) ABSTRACT

According to one embodiment, a nonvolatile semiconductor memory device includes a stacked body, a semiconductor pillar and a charge storage layer. The stacked body includes a plurality of insulating films alternately stacked with a plurality of electrode films. The semiconductor pillar is buried in the stacked body, and extends in a stacking direction of the insulating films and the electrode films. The charge storage layer is provided between the electrode films and the semiconductor pillar. The electrode films are divided into a plurality of control gate electrodes. Each of the plurality of control gate electrodes faces the semiconductor pillar and sandwiches the charge storage layer with the semiconductor pillar.

3 Claims, 26 Drawing Sheets

|  | MEMORY TRANSISTOR 35b | | | | |
|---|---|---|---|---|---|
|  |  | STATE 1 | STATE 2 | STATE 3 | STATE 4 | NOT USED |
| MEMORY TRANSISTOR 35a | STATE 1 | 9 | 10 | 11 | 12 | 1 |
| | STATE 2 | — | 13 | 14 | 15 | 2 |
| | STATE 3 | — | — | 16 | 17 | 3 |
| | STATE 4 | — | — | — | 18 | 4 |
| | NOT USED | 5 | 6 | 7 | 8 | × |

FIG. 8

| (a) | (b) | | (c) | | (d) | (e) |
|---|---|---|---|---|---|---|
| MEMORY CELL VALUE | USE VALUE | | STATE | | RELATIONSHIP BETWEEN GATE VOLTAGE AND CURRENT (HORIZONTAL AXIS: GATE VOLTAGE VERTICAL AXIS: CURRENT) | CURRENT STATE |
| | 35a | 35b | 35a | 35b | | |
| 1 | 1 | 0 | 1 | — | | <000> |
| 2 | 1 | 0 | 2 | — | | <001> |
| 3 | 1 | 0 | 3 | — | | <011> |
| 4 | 1 | 0 | 4 | — | | <111> |
| 5 | 0 | 1 | — | 1 | | <000> |
| 6 | 0 | 1 | — | 2 | | <003> |
| 7 | 0 | 1 | — | 3 | | <033> |
| 8 | 0 | 1 | — | 4 | | <333> |
| 9 | 1 | 1 | 1 | 1 | | <000> |
| 10 | 1 | 1 | 1 | 2 | | <003> |
| 11 | 1 | 1 | 1 | 3 | | <033> |
| 12 | 1 | 1 | 1 | 4 | | <333> |
| 13 | 1 | 1 | 2 | 1 | | <001> |
| 14 | 1 | 1 | 2 | 2 | | <004> |
| 15 | 1 | 1 | 2 | 3 | | <034> |
| 16 | 1 | 1 | 2 | 4 | | <334> |
| 17 | 1 | 1 | 3 | 1 | | <011> |
| 18 | 1 | 1 | 3 | 2 | | <014> |
| 19 | 1 | 1 | 3 | 3 | | <044> |
| 20 | 1 | 1 | 3 | 4 | | <344> |
| 21 | 1 | 1 | 4 | 1 | | <111> |
| 22 | 1 | 1 | 4 | 2 | | <114> |
| 23 | 1 | 1 | 4 | 3 | | <144> |
| 24 | 1 | 1 | 4 | 4 | | <444> |

FIG. 10      $V_{read1}$  $V_{read2}$  $V_{read3}$

|  | MEMORY TRANSISTOR 35b ||||||
|  |  | STATE 1 | STATE 2 | STATE 3 | STATE 4 | NOT USED |
| MEMORY TRANSISTOR 35a | STATE 1 | 9 | 10 | 11 | 12 | 1 |
| | STATE 2 | 13 | 14 | 15 | 16 | 2 |
| | STATE 3 | 17 | 18 | 19 | 20 | 3 |
| | STATE 4 | 21 | 22 | 23 | 24 | 4 |
| | NOT USED | 5 | 6 | 7 | 8 | × |

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2010-025530, filed on Feb. 8, 2010; the entire contents of which are incorporated herein by reference.

FIELD

Embodiments described herein relate generally to a nonvolatile semiconductor memory device.

BACKGROUND

A package-processed stacked memory is attracting attention as a method of reducing costs and enabling high integration in relation to a non-volatile semiconductor memory device. A package-processed stacked memory is manufactured by firstly providing alternate laminated layers of an insulating film and an electrode film on a semiconductor substrate to form a stacked body. Then a through-hole is formed in the stacked body with a lithography method, a blocking layer, a charge storage layer, and a tunneling layer are sequentially formed on an inner surface of the through-hole, and a silicon pillar is buried into the through-hole. In this stacked memory, a memory transistor is formed in the intersection of the electrode film and the silicon pillar, to form a memory cell. Since the memory cells can be stacked in a three-dimensional configuration in this type of stacked memory, high integration and cost reduction in relation to a memory device is enabled (for example refer to JP-A No. 2009-146954 (Kokai)). However demand for further increases in integration is expected in relation to this type of stacked memory.

BRIEF DESCRIPTION OF THE DRAWINGS

FIG. 8 illustrates the relationship between the state of two memory transistors belonging to one memory cell and the value of the memory cell in the first embodiment;

FIG. 10 illustrates the pattern of the data stored in one memory cell in the second embodiment;

FIG. 11 illustrates the relationship between the combination of the state of two memory transistors belonging to one memory cell and the memory cell value in the second embodiment;

DETAILED DESCRIPTION

In general, according to one embodiment, a nonvolatile semiconductor memory device includes a stacked body, a semiconductor pillar and a charge storage layer. The stacked body includes a plurality of insulating films alternately stacked with a plurality of electrode films. The semiconductor pillar is buried in the stacked body, and extends in a stacking direction of the insulating films and the electrode films. The charge storage layer is provided between the electrode films and the semiconductor pillar. The electrode films are divided into a plurality of control gate electrodes. Each of the plurality of control gate electrodes faces the semiconductor pillar and sandwiches the charge storage layer with the semiconductor pillar.

Various embodiments will be described hereinafter with reference to the accompanying drawings.

First, a first embodiment of the invention will be described.

Figure 1:
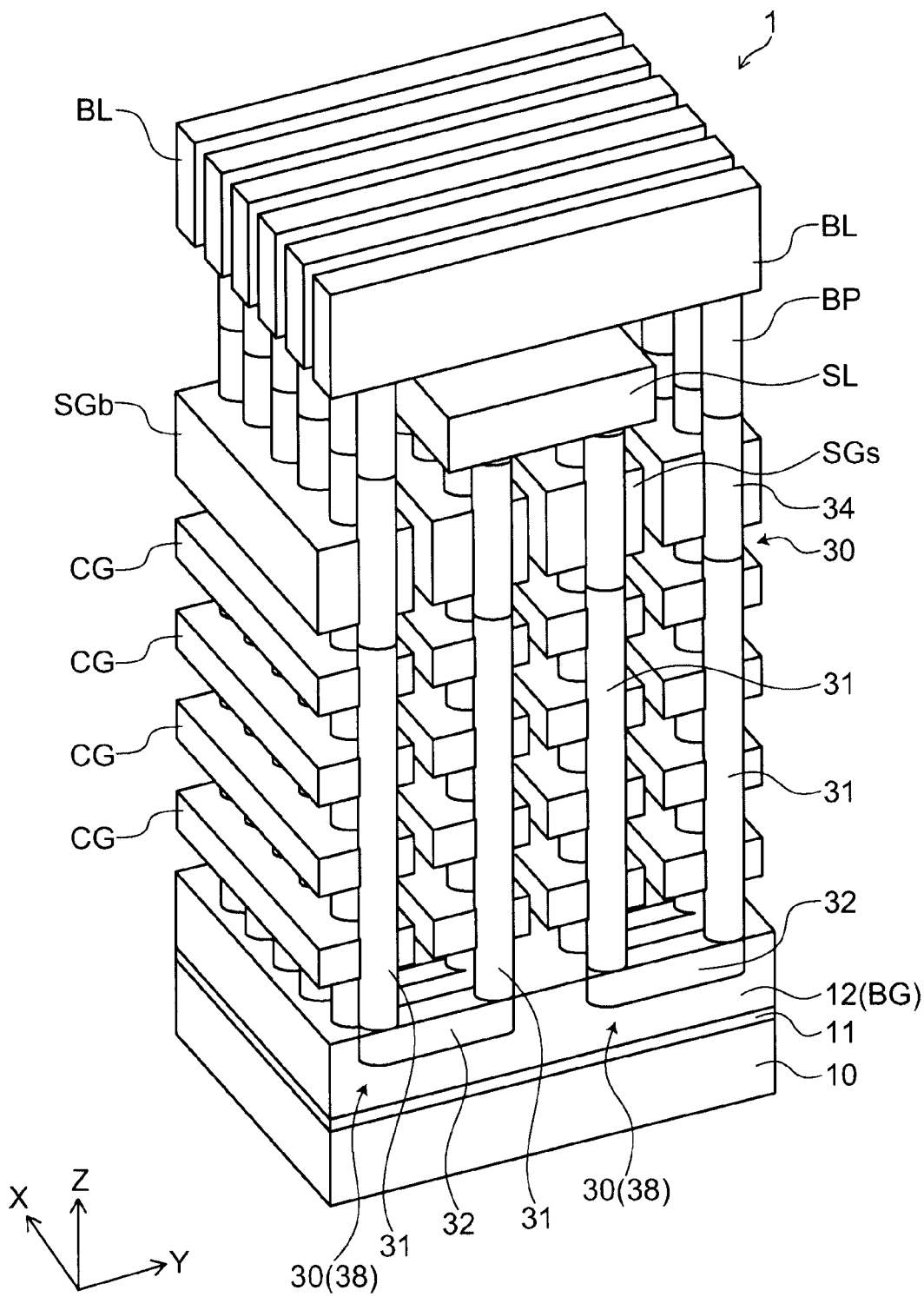
FIG. 1 is a perspective view illustrating a nonvolatile semiconductor memory device according to a first embodiment.

FIG. 1 is a perspective view illustrating a nonvolatile semiconductor memory device according to the embodiment.

Figure 2:
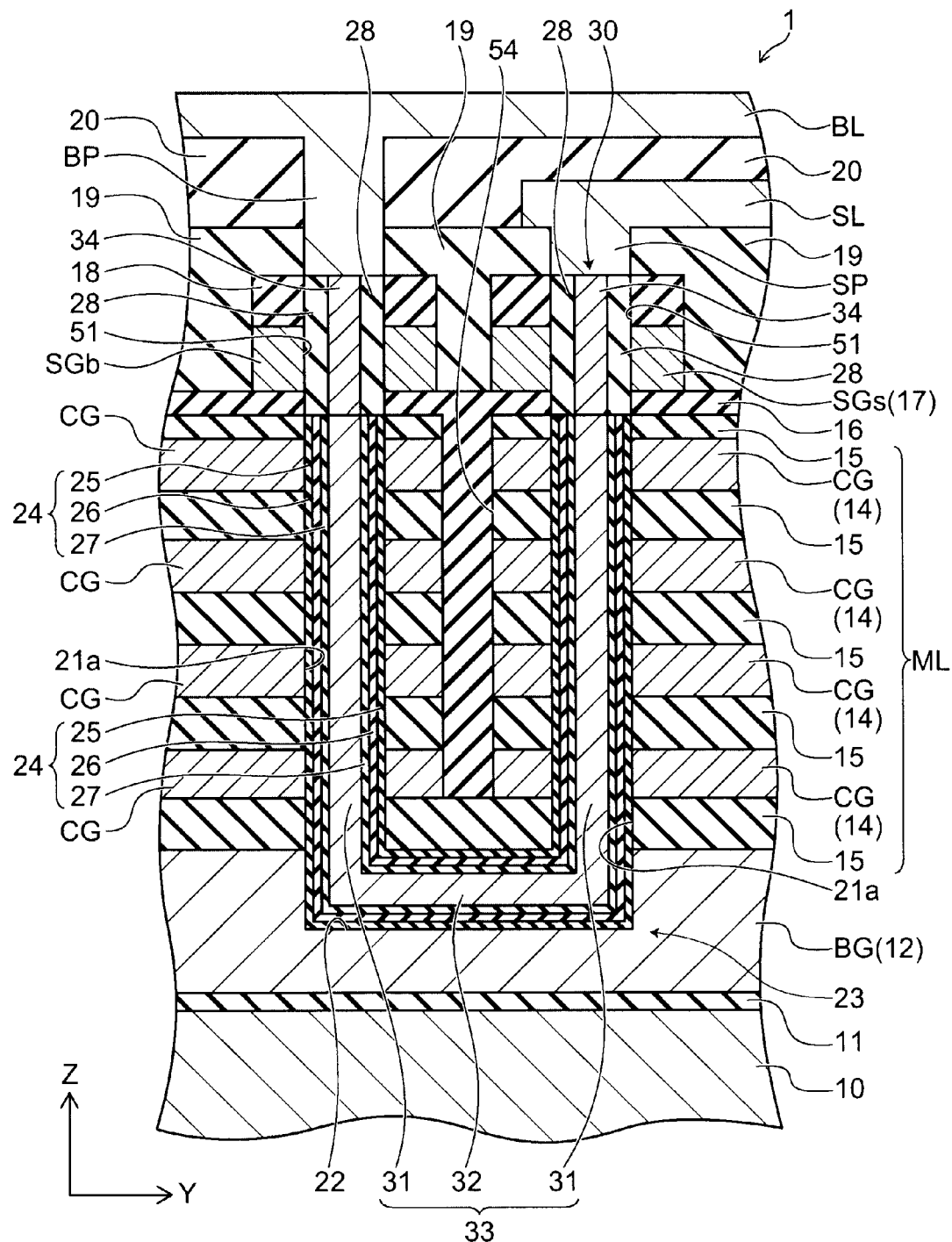
FIG. 2 is a cross-sectional view illustrating the nonvolatile semiconductor memory device according to the first embodiment.

FIG. 2 is a cross-sectional view illustrating the nonvolatile semiconductor memory device according to the embodiment.

Figure 3:
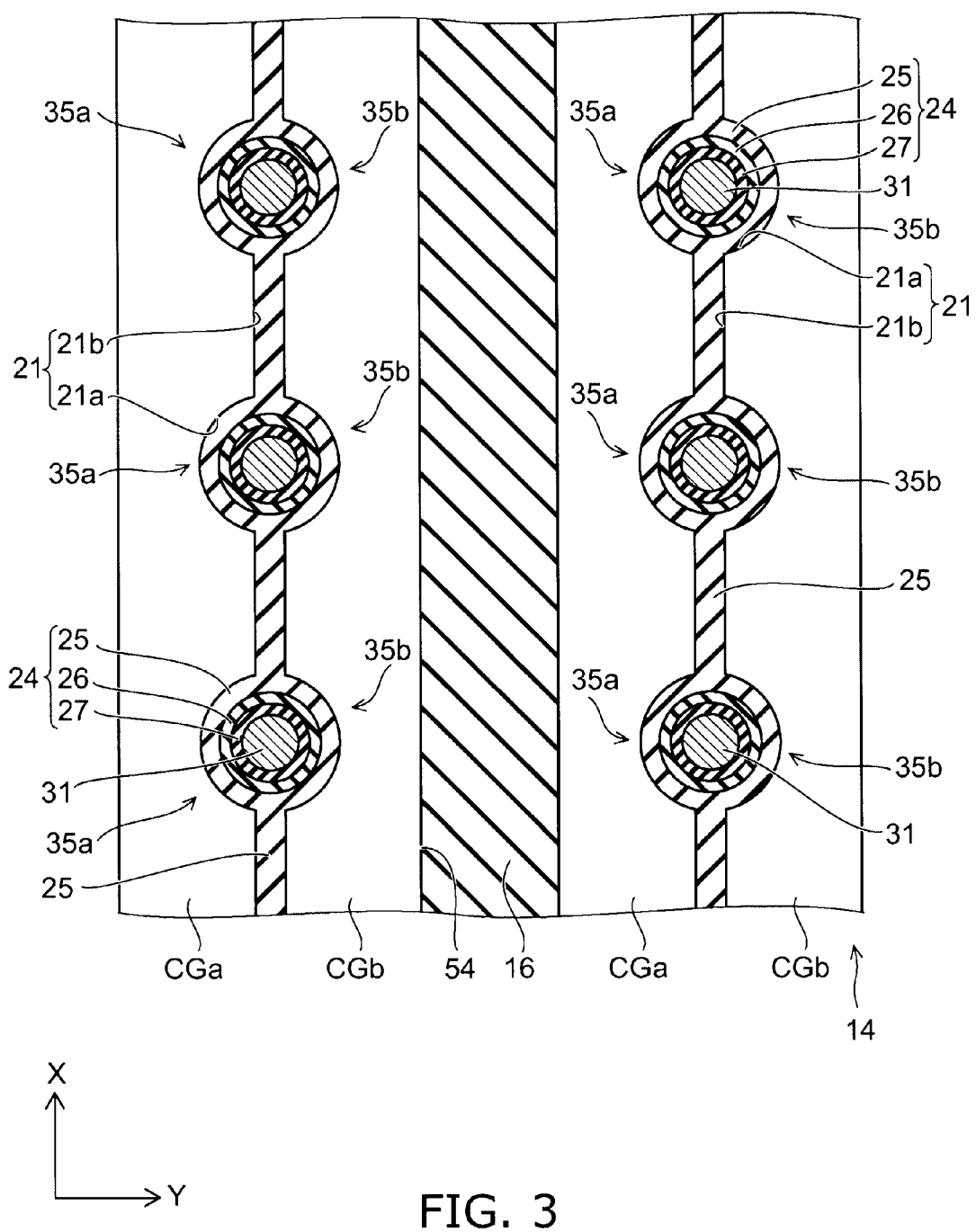
FIG. 3 is a cross-sectional view illustrating a control gate electrode and a silicon pillar in the nonvolatile semiconductor memory device according to the first embodiment.

FIG. 3 is a cross-sectional view illustrating a control gate electrode and a silicon pillar in the nonvolatile semiconductor memory device according to the embodiment.

Figure 4:
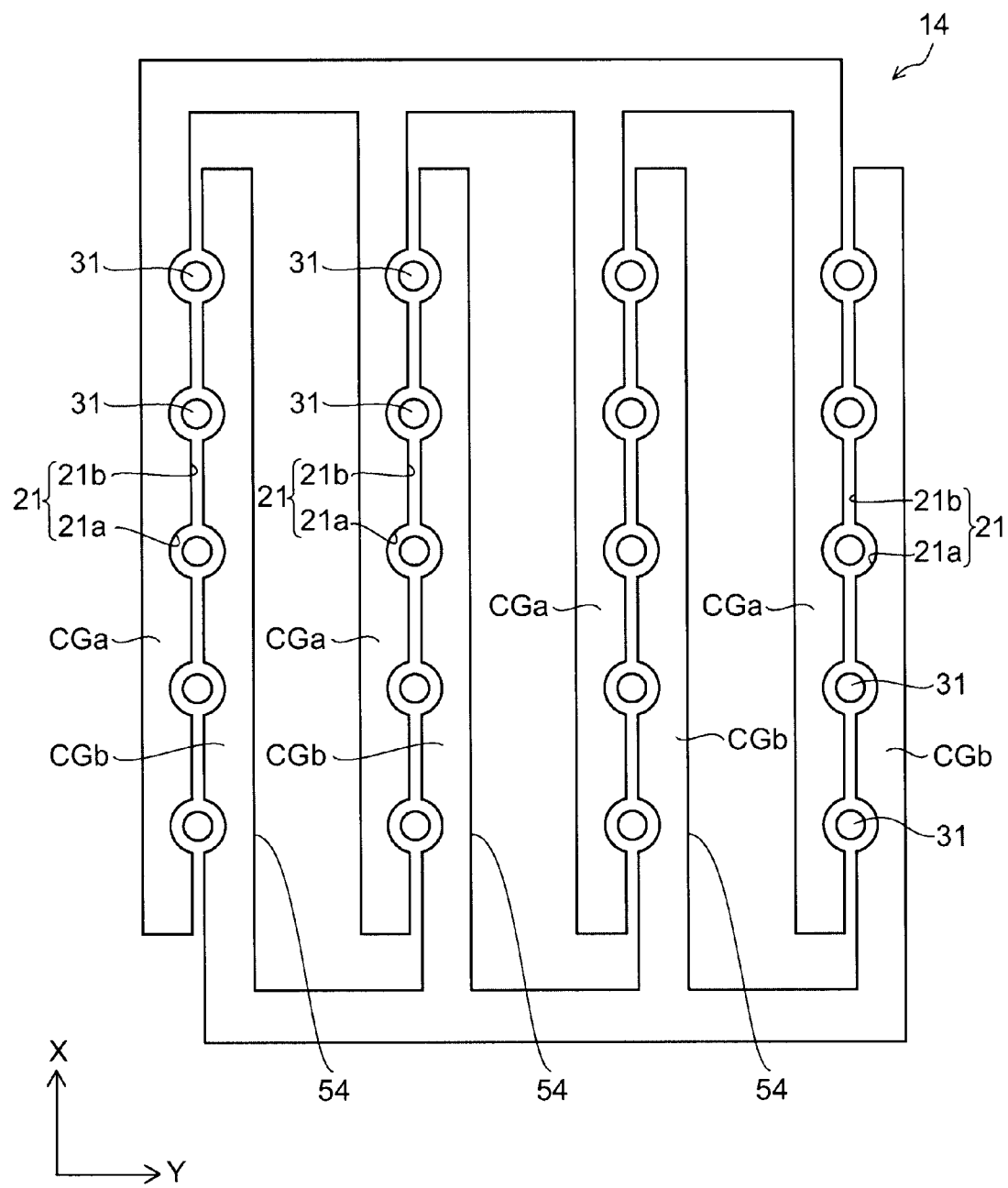
FIG. 4 is a plan view schematically illustrating the shape of a control gate electrode in a wider range than that illustrated in FIG. 3.

FIG. 4 is a plan view schematically illustrating the shape of a control gate electrode in a wider range than that illustrated in FIG. 3.

Figure 5:
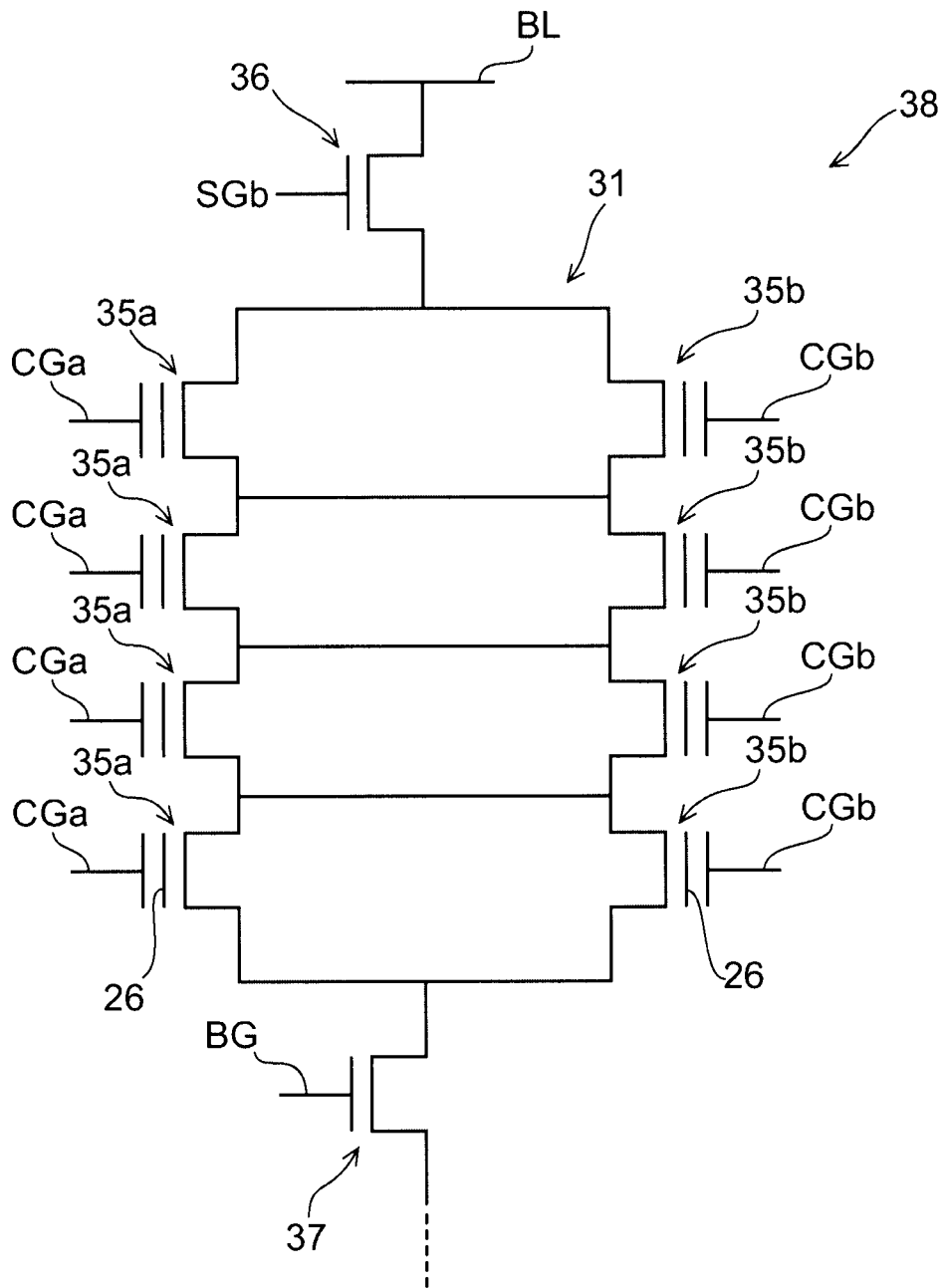
FIG. 5 is a circuit diagram illustrating a portion of a memory string of the nonvolatile semiconductor memory device according to the first embodiment.

FIG. 5 is a circuit diagram illustrating a portion of a memory string of the nonvolatile semiconductor memory device according to the embodiment.

For easier viewing of the drawings in FIG. 1 and FIG. 4, as a rule, only the conductive portions are illustrated, and the insulating portions are omitted. FIG. 5 illustrates a portion corresponding to one silicon pillar.

First, distinctive portions of the embodiment will be described summarily.

The distinctive portion of the nonvolatile semiconductor memory device according to the embodiment is such that respective electrode films are divided into multiple control gate electrodes and two control gate electrodes in each silicon pillar are opposed to sandwich a charge storage layer in a three-dimensional stacked memory device that buries multiple silicon pillars into a stacked body in which an electrode film is alternately stacked with an insulating film. Thus, a memory transistor can be formed at the nearest connection point of the silicon pillar and the control gate electrode. Furthermore each transistor is a multi-value transistor that enables to store values of three levels or more. More values can be stored in each memory cell by handling two memory transistors formed respectively at a nearest connection point of each silicon pillar and each electrode film as a single memory cell.

The detailed description of the nonvolatile semiconductor memory device according to the embodiment will be described below.

As illustrated in FIG. 1 and FIG. 2, the nonvolatile semiconductor memory device 1 according to the embodiment (hereinbelow simply referred to as "device 1") includes a silicon substrate 10. The silicon substrate 10 includes a memory cell region that forms a memory cell and a peripheral circuit region (not illustrated) that is disposed on the periphery of the memory cell region and that forms peripheral circuits. A peripheral circuit is a circuit that performs programming, reading and erasing of data with respect to the memory cell.

In the memory cell region, an insulating film 11 is provided on the silicon substrate 10, and on that layer, is formed a conductive layer, for example, a polysilicon layer 12 that is doped with an impurity to thereby form a back gate electrode BG. Multiple electrode films 14 and insulating films 15 are alternately stacked on the back gate electrode BG to form a stacked body ML. The electrode film 14 is formed from silicon that is doped with an impurity. The electrode film 14 may be formed using tantalum nitride, or a silicate that has main components of a metal and silicon. In this case, the metal includes, for example, nickel or tungsten, or the like. The insulating layer 15 is formed from a silicon oxide that has main components of silicon and oxygen. The electrode films 14 are insulated. Although the example illustrated in FIG. 1 and FIG. 2 or the like illustrates four electrode films 14, the invention is not limited thereto.

For convenience of description in the specification, an XYZ orthogonal coordinate system will now be introduced. In this coordinate system, two mutually orthogonal directions parallel to an upper surface of the silicon substrate 10 are taken as an X direction and a Y direction. A direction orthogonal to each of the X direction and the Y direction, that is, the stacking direction of each of the layers, is taken as a Z direction.

As illustrated in FIG. 1 to FIG. 4, multiple penetrating trenches 21 and trenches 54 that are aligned along the X direction and Z direction are aligned alternately along the Y direction. The penetrating trenches 21 pierce the stacked body ML and the lower ends thereof reach the back gate electrode BG. Although the trenches 54 reach the lowermost insulating film 15 of the stacked body ML, they do not pierce the stacked body ML. Multiple through-holes 21a are formed at an equidistant interval in the penetrating trenches 21 along the X direction, and portions other than the through-holes 21a in the penetrating trenches 21 are formed as a slit 21b. The shape of the through-hole 21a is formed as a cylinder extending along the Z direction. The slits 21b are formed to connect adjacent through-holes 21a along the X direction.

The electrode film 14 is divided along the Y direction by the penetrating trenches 21 and the trenches 54 in a central portion along the X direction in the stacked body ML, and to form multiple control gate electrodes CG extending along the X direction. In other words, an outer edge of each through-hole 21a and slit 21b is determined by two control gate electrodes CG adjacent to each other along the Y direction. For convenience of description, one of the two control gate electrodes CG that configure the outer edge of one through-hole 21a is termed the control gate electrode CGa, and the other electrode is termed the control gate electrode CGb. As viewed along the Z direction, each layer of the electrode films 14 is collectively patterned. The electrode film 14 is not divided along the Y direction in each of the X-direction ends of the stacked body ML. For this reason, as illustrated in FIG. 4, each of the electrode films 14 is patterned to form one pair of comb-shaped configurations.

A communicating hole 22 is formed in an upper layer portion of the back gate electrode BG so that the lower end of one through-hole 21a communicates with the lower end of one other through-hole 21a displaced by a one row along the Y direction as viewed from the through-hole 21a. Thus, one connected U-shaped hole 23 is formed by the pair of through-holes 21a adjacent to each other along the Y direction and the communicating hole 22 communicating therebetween. Multiple U-shaped holes 23 are formed in the stacked body ML.

A memory film 24 is provided on an inner surface of the U-shaped hole 23. An insulative blocking layer 25, a charge storage layer 26, and an insulative tunneling layer 27 are deposited in this order from an outer side on the memory film 24. The blocking layer 25 makes contact with the back gate electrode BG, the control gate electrode CG, and the insulating film 15. The blocking layer 25 substantially does not permit conduction of electrical current even when a voltage is applied within the range of the drive voltage of the device 1, and is, for example, formed by alumina having main components of alumina and oxygen. The blocking layer 25 may be formed from a silicon oxide that has main components of silicon and oxygen, or may be formed from a silicon oxynitride that has main components of silicon, oxygen, and nitrogen.

The charge storage layer 26 has the capacity to store a charge, for example, includes a trap site, and may be formed from a silicon nitride that has main components of silicon and nitrogen. The charge storage layer 26 may be formed from a hafnium oxide that has main components of hafnium and oxygen. The tunneling layer 27 normally includes insulative characteristics. However when a predetermined voltage within a range of the drive voltage of the device 1 is applied, the film enables conduction of a tunneling current, and is formed, for example, by a silicon oxide that has main components of silicon and oxygen. The inner portion of the slit 21b is filled with the blocking layer 25. In the embodiment, the charge storage layer 26 is not formed in the slit 21.

A semiconductor material doped with an impurity, e.g., polysilicon, is filled into the interior of the U-shaped hole 23. Thus, a U-shaped silicon member 33 is provided in an inner portion of the U-shaped hole 23. The portion positioned in the through-hole 21a of the U-shaped silicon member 33 is formed as a silicon pillar 31, and the portion positioned in the communicating hole 22 is formed as a connecting member 32. The silicon pillar 31 has a columnar configuration, e.g., a circular columnar configuration, extending along the Z direction. The connecting member 32 has a columnar configuration, e.g., a quadrilateral columnar configuration, extending along the Y direction. Two of the silicon pillars 31 and one of the connection members 32 configuring the U-shaped silicon member 33 are integrally formed. Accordingly, the U-shaped silicon member 33 is formed continuously without breaks along the longitudinal direction thereof. The U-shaped silicon member 33 is insulated from the back gate electrode BG and the control gate electrode CG by the memory film 24.

The insulating film 16, the conductive film 17 and the insulating film 18 are deposited in order on the stacked body ML. The insulating film 16 for example is formed from a silicon oxide, and is filled into the trench 54. The conductive film 17 for example is formed from polysilicon, is divided along the Y direction, and forms multiple selection gate electrodes SG extending along the X direction. The selection gate electrodes SG are provided at each row of silicon pillars 31 aligned along the X direction. The insulating film 18 is formed, for example, from a silicon oxide.

Multiple through-holes 51 are made in the insulating film 16, the selection gate electrode SG, and the insulating film 18. Each of the through-holes 51 is made in a region immediately above each of the through-holes 21a to communicate with each of the through-holes 21a. Here, because the selection gate electrode SG extends along the X direction, the through-holes 51 aligned along the X direction pierce the same selection gate electrode SG. A gate insulating film 28 is formed on the inner face of the through-hole 51. Polysilicon, for example, is filled into the interior of the through-hole 51 to form a silicon pillar 34. The silicon pillar 34 has a columnar configuration, e.g., a circular columnar configuration, extending along the Z direction. The lower end portion of the silicon pillar 34 is connected to the upper end portion of the silicon pillar 31 formed in a region directly therebelow. A U-shaped pillar 30 is formed from the U-shaped silicon member 33 and the pair of silicon pillars 34 connected to the upper end portions thereof.

The multiple silicon pillars 31 aligned along the Y direction are disposed in proximity to the pair of mutually different control gate electrodes CGa, CGb, and the multiple silicon pillars 34 aligned along the Y direction pierce mutually different selection gates SG. On the other hand, the multiple silicon pillars 31 aligned along the X direction are disposed in proximity to the pair of common control gate electrodes CGa, CGb, and the multiple silicon pillars 34 aligned along the X direction pierce the common selection gate SG.

An insulating film 19 is provided on the insulating film 18, and the source line SL extending along the X direction is provided on the insulating film 19. In each group that is formed from the four selection gate electrodes SG that are continuously aligned along the Y direction, the source line SL is disposed immediately above the two continuously-aligned selection gate electrodes SG and is not disposed immediately above the remaining two selection gate electrodes SG. An insulating film 20 that covers the source line SL is provided on the insulating film 19, and multiple bit lines BL extending along the Y direction are provided on the insulating film 20. The source line SL and the bit lines BL are respectively formed from a metal.

One silicon pillar 34 of the pair of silicon pillars 34 that belong to each of the U-shaped pillars 30 is connected to the source line SL via a source plug SP buried in the insulating film 19. One other silicon pillar 34 is connected to the bit line BL via a bit plug BP buried in the insulating films 19 and 20. Therefore, the U-shaped pillar 30 is connected between the bit line BL and the source line SL. In FIG. 1 and FIG. 2, of the selection gate electrodes SG pierced by the U-shaped pillar 30, the selection gate electrode SG disposed on the bit line side is denoted as the selection gate electrode SGb, and the selection gate electrode SG disposed on the source line side is denoted as the selection gate electrode SGs. The U-shaped pillars 30 aligned along the X direction are connected to a common source line, and are connected to the mutually different bit lines BL. The U-shaped pillars 30 aligned along the Y direction are connected to each of the source lines SL by two a couple, and are connected to a common bit line BL.

The control gate electrodes CGa and CGb function as a gate electrode in the device 1, and the portion facing the control gate electrodes CGa and CGb in the silicon pillar 31 functions as a channel. Thereby, Vertical memory transistors 35a and 35b (commonly referred to as "memory transistor 35") are formed in a contact portion between the silicon pillar 31 and the control gate electrodes CGa and CGb, respectively. Each memory transistor 35 stores data by storing electrons in a charge storage layer 26 disposed between the silicon pillar 31 and the control gate electrode CG. In the embodiment, two memory transistors 35a and 35b formed in relation to one silicon pillar 31 and equally spaced along the Z direction are treated as one memory cell. In the device 1, since multiple silicon pillars 31 are aligned along the X direction and Y direction in a matrix configuration in the stacked body ML, multiple memory cells are aligned three dimensionally along the X direction, the Y direction and the Z direction.

A selection transistor 36 is formed in the intersecting portion of the silicon pillar 34 and the selection gate electrode SG, and forms the silicon pillar 34 as a channel, the selection gate electrode SG as a gate electrode, and the gate insulating film 28 as a gate insulating film. The selection transistor 36 is also a vertical transistor in the same manner as the memory transistor 35. The memory film 24 is interposed between the connecting member 32 and the back gate electrode BG, and thus a back gate transistor 37 configuring the connecting member 32 as a channel, the back gate electrode BG as a gate electrode, the memory film 24 as the gate insulating film is formed. In other words, the back gate electrode BG functions as an electrode controlling the conduction state of the connecting member 32 with an electrical field.

As a result, a memory string 38 connecting the bit line BL and the source line SL is configured along each U-shaped pillar 30. The selection transistor 36 is provided at each of the ends in the memory string 38, a back gate transistor 37 is provided in the central portion, and multiple memory transistors 35 are connected between each selection transistor 36 and back gate transistor 37. As illustrated in FIG. 5, the memory transistor 35 is connected between the selection transistor 36 and the back gate transistor 37 in two-transistor parallel configuration, and in series by a number equal to the stacking number of the electrode film 14.

On the other hand, the peripheral circuit (not illustrated) formed in the peripheral circuit region can supply a three-level programming potential, or can supply the same level of programming potential in a three-level time interval, to the control gate electrode CG. Furthermore, the peripheral circuit can supply at least a three-level reading potential to the control gate electrode CG. In addition, the peripheral circuit can integrate information showing the level of the supplied reading potential, information showing which control gate electrode is supplied with the reading potential, and information showing the current flowing in the silicon pillar 31, and read out the data stored in the memory cell.

Next the operation of the embodiment will be described.

Figure 6:
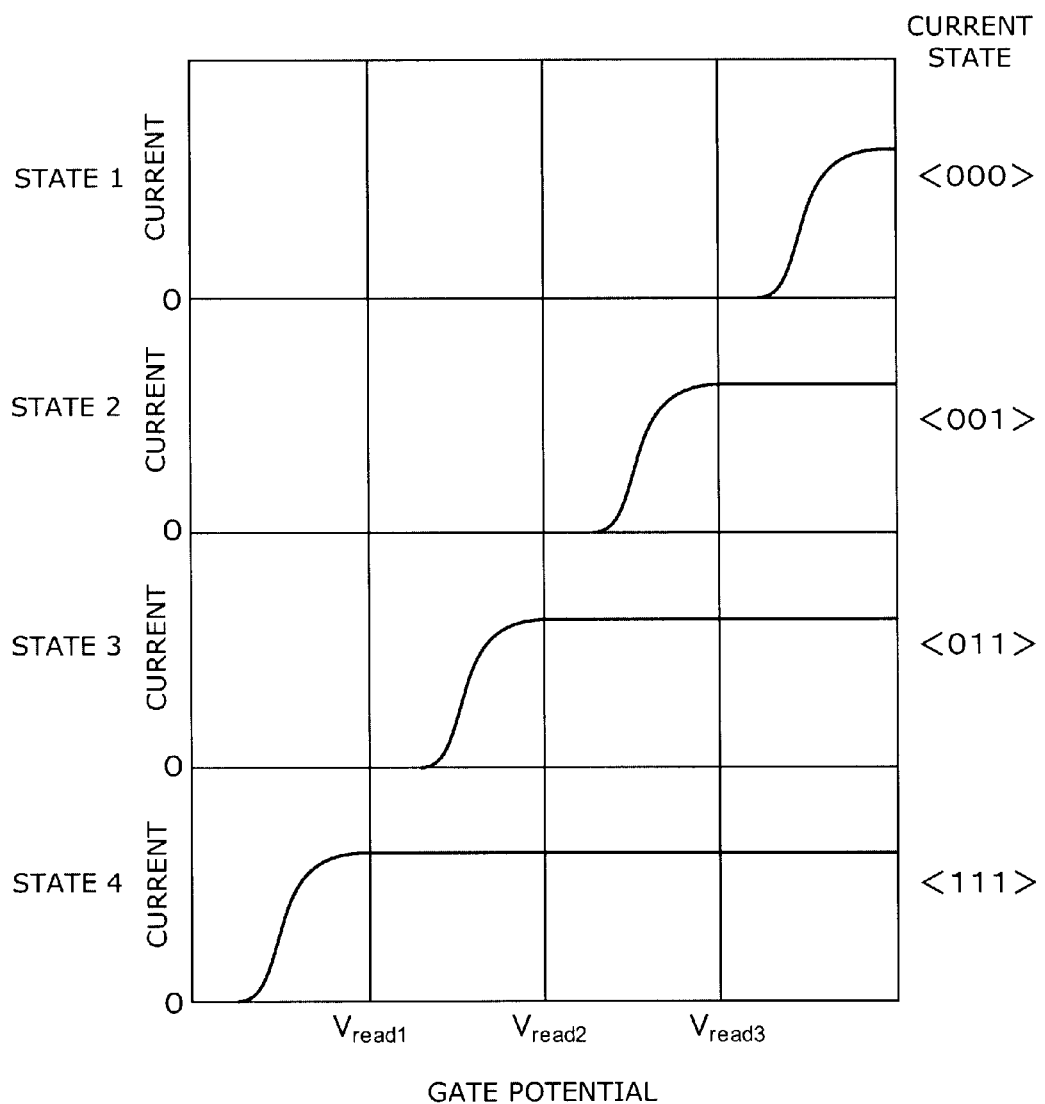
FIG. 6 is a graph illustrating the operation of one memory transistor of the first embodiment and illustrates the gate voltage on the horizontal axis and the drain current in the vertical axis.

FIG. 6 is a graph illustrating the operation of a memory transistor and illustrates the gate voltage on the horizontal axis and the drain current (hereinbelow simply referred to as "current") in the vertical axis.

Figure 7:
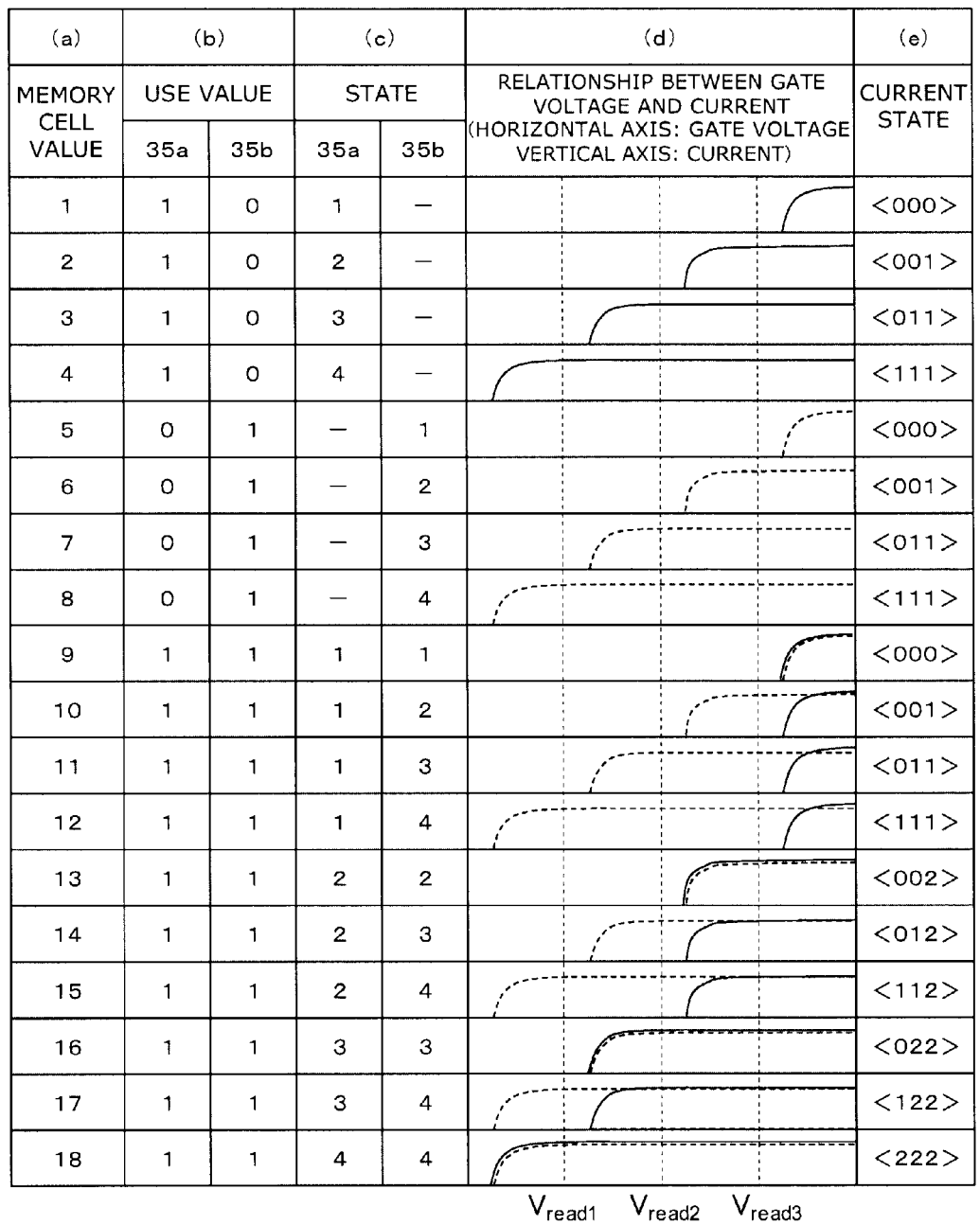
FIG. 7 illustrates the pattern of the data stored in one memory cell in the first embodiment.

FIG. 7 illustrates the pattern of the data stored in one memory cell.

FIG. 8 illustrates the relationship between the state of two memory transistors belonging to one memory cell and the value of the memory cell.

Firstly, the operation of one memory transistor will be described.

As illustrated in FIG. 6, the memory transistor 35 is a multivalue transistor, and for example is enabled to be configured in four states. In other words, a charge stored in the charge storage layer 26 can be varied between three levels as a result of supply by the peripheral circuit of three levels of programming potentials to the control gate electrode CG, or by application of three levels of programming periods. The memory transistor 35 may adopt four states by adding a state in which the charge is not stored in the charge storage layer 26 to the three levels of states. The threshold value of the memory transistor 35 shifts in response to a change in the charge amount stored in the charge storage layer 26. For example, when the memory transistor 35 is an n-type transistor, if a potential is applied to the control gate electrode CG that is higher than the threshold, a source/drain current flows into the memory transistor 35. However when electrons are stored in the charge storage layer 26, the threshold is shifted to positive.

The "state 1" illustrated in FIG. 6 illustrates the highest electron amount stored in the charge storage layer 26. When the reading potential applied to the control gate electrode CG is in three levels in ascending order of $V_{read1}$, $V_{read2}$, $V_{read3}$, even when the value of the reading potential in the "state 1" takes any of the values $V_{read1}$, $V_{read2}$, $V_{read3}$, a current does not flow in the memory transistor 35. Hereafter, this type of state in the current is denoted as a current state (100). A value of "0" in the three figures in the denotation of the current states shows that no current is present, and a value of "1" indicates that there is a current.

A "state 2" illustrated in FIG. 6 is a state in which the electron amount stored in the charge storage layer 26 is lower than the "state 1". When the reading potential in the "state 2" takes either the values $V_{read1}$, $V_{read2}$, a current does not flow, and when it takes the value $V_{read3}$, a current flows. Hereinbelow, this current state is denoted by "001". A "state 3" is a state in which the stored electron amount is lower than the "state 2". When the reading potential in the "state 2" takes the value $V_{read1}$, a current does not flow, and when it takes either of the values $V_{read2}$, $V_{read3}$, a current is present. Hereinbelow, this current state is denoted by "011". A "state 4" is a state in which electrons are substantially not stored in the charge storage layer 26. When in a "state 4", a current flows when the value of the reading potential takes any of the values $V_{read1}$, $V_{read2}$, $V_{read3}$. This current state is denoted as "111". Thus, a single memory transistor 35 can adopt four states that are read as respective current states of "000", "001", "011", and "111".

The operation of one memory cell will now be described.

As described above, one memory cell is configured from two memory transistors 35*a* and 35*b*. When driving the memory cell, only the memory transistor 35*a* may be driven, only the memory transistor 35*b* may be driven, or each of the memory transistors 35*a* and 35*b* may be driven. In the embodiment, the channel width of each memory transistor, that is to say, the lengths along the outer edge of the silicon pillars 31 in the regions respectively opposed to the control gate electrodes CGa and CGb in the silicon pillars 31 along the XY plane, are substantially equal. Thus, a substantially equal current is applied to the memory transistors 35*a* and 35*b*.

FIG. 7 illustrates the states taken by a single memory cell. In order from the left of FIG. 7, (a) is the memory cell value, (b) is the use value illustrating the presence or absence of use of each memory transistor, (c) is the state of each memory transistor, (d) is a graph schematically illustrating the relation between the gate voltage of each memory transistor and drain current, and (e) is the state of the current in the memory cell. When a potential is supplied to the control gate electrode of the memory transistor, the use value (b) takes a value of "1", and when it is not supplied, it takes a value of "0". The method of denotation in respect of the state of the memory transistor (c) and the graph (d) is the same as that used in FIG. 6. In (d), the solid line illustrates the voltage-current curve of the memory transistor 35*a*, and the dotted line illustrates the voltage-current curve of the memory transistor 35*b*. The current of the entire memory cell is the sum of the current flowing in the memory transistor 35*a* and the current flowing in the memory transistor 35*b*.

The value showing the state of the current in the memory cell (e) is generally proportional to the amount of current. In other words, a value of "0" denotes a situation in which no current flows in any of the memory transistors, a value of "1" denotes a situation in which current flows into only one of the memory transistors, and a value of "2" denotes a situation in which current flows into each of the memory transistors. For example, when the memory transistor 35*a* is in "state 2" ("001"), and the memory transistor 35*b* is in "state 3" ("011"), at a reading potential $V_{read1}$, a current does not flow to either the memory transistors 35*a* and 35*b*, at a reading potential $V_{read2}$, a current flows only to the memory transistor 35*b* and, at a reading potential $V_{read3}$, a current flows to both the memory transistors 35*a*, 35*b*. Therefore the state of current in the overall memory cell is "012". In the example illustrated in FIG. 7, the value of the memory cell is "14". As illustrated in FIG. 7, one memory cell can take 18 values by the combination of the three values expressing the state of current, and the two figures configuring the use value.

The relationship of the state and the presence/absence of using each of the memory transistors illustrated in FIG. 7 and the memory cell value are expressed as illustrated in FIG. 8. In other words, each memory transistor can take five states by adding a non-use state to the four states above, and therefore the memory cell can adopt 5×5=25 by combination of the two memory transistors. However the single state of the above 25 states in which none of the memory transistors is used is omitted since current flow is not obtained. Furthermore when both of the memory transistors 35*a* and 35*b* are used, since it is not possible to discriminate which memory transistor of the memory transistors through which current in the silicon pillar has flowed, the situation in which the state of the memory transistor 35*a* is substituted by the state of the memory transistor 35*b* in relation to a memory cell is also omitted. In other words, the pair of states in the diagonal corners of the matrix in FIG. 8 is counted as a single state. However, since the use value can be used to discriminate use of only the memory transistor 35*a* from use only the memory transistor 35*b*, that state is not omitted. Therefore the number of memory cell values is 18 as described above.

The effect of the embodiments will be described below.

As described above, according to the embodiment, since two control gate electrodes CGa and CGb are opposed in a single silicon pillar 31 in a memory cell that is formed in each intersection portion of the silicon pillar 31 and the electrode film 14, two memory transistors can be connected in series. Thus, as described above, 18 values can be stored in one memory cell, and thereby a large improvement in the level of integration of the data stored in the device 1 is enabled. Since two memory transistors are formed in one memory cell by merely applying suitable patterning to the electrode film 14, in comparison to forming only one memory transistor in one memory cell, there is no increase in the number of manufacturing processes, and the dimensions of the device 1 are not increased. Furthermore since two memory transistors are provided in one memory cell, it is not necessary to store many values in one memory transistor. Thus, the permitted range of threshold values for each memory transistor can be increased, and therefore operational reliability can be increased.

In this regard, in the event each memory cell is configured by one memory transistor with a configuration in which one silicon pillar pierces only one control gate electrode in the intersection portion of the silicon pillar and the electrode film, even when the memory transistor is configured by a four-value transistor, only four values can be stored in the overall memory cell. Furthermore, when it is attempted to increase the number of values stored in one memory transistor, the range of the threshold distribution is narrowed, and there is a tendency for malfunction due to divergence of the threshold values. In addition, since the number of reading potential levels is increased, the reading time is increased.

However in the embodiment, although 18 values are discriminated by combining the three values indicating the state of the current and the two values indicating the use state of each memory transistor, the invention is not limited in this regard. For example, it is not necessary to take the use state of the memory transistor into account. In this case, although it is not possible to discriminate between use of only the memory transistor 35a and use of only the memory transistor 35b, even this configuration enables storage of 14 values.

A second embodiment of the invention will be described below.

Figure 9:
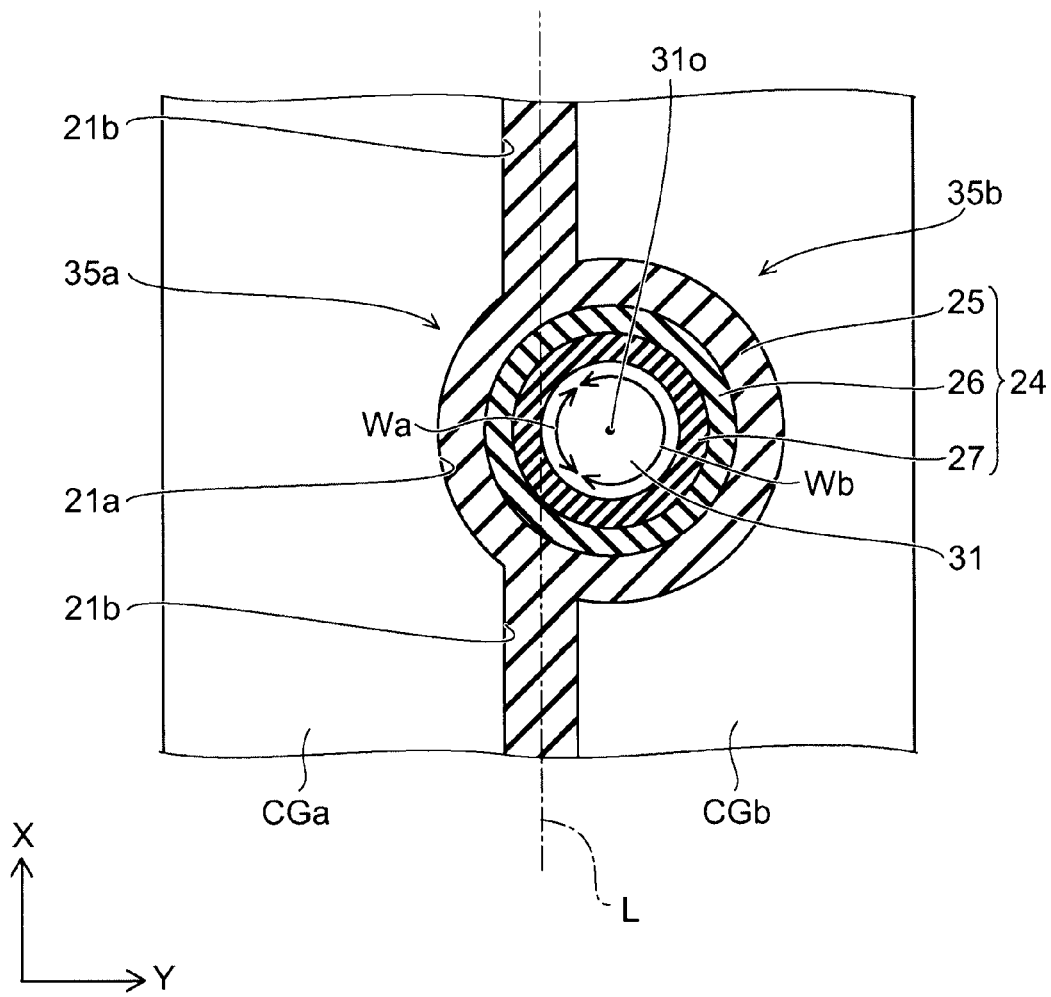
FIG. 9 is a cross-sectional view illustrating the control gate electrode and the silicon pillar in a non-volatile semiconductor memory device according to a second embodiment.

FIG. 9 is a sectional view illustrating an example of the control gate electrode and the silicon pillar in a non-volatile semiconductor memory device according to the embodiment.

In the embodiment, the positional relationship of the control gate electrode and the silicon pillar is different from the first embodiment. That is to say, as illustrated in FIG. 9, a central axis 310 of the silicon pillar 31 in the XY plane is disposed at a distance from portions other than the portions configuring the through-holes 21a of the end edges that are opposed in the two control gate electrodes CGa and CGb facing the silicon pillar 31, that is to say, from the straight line L connecting the middlepoints of the portions configuring the slits 21b.

In the example illustrated in FIG. 9, the central axis 310 of the silicon pillar 31 is disposed away from the straight line L on the control gate electrode CGb side. Thereby, the channel widths Wb of each memory transistor 35b, that is to say, the length Wb along the outer edge of the silicon pillars 31 in the region facing the control gate electrodes CGb of the silicon pillar 31 in the XY plane, is three times that of the channel width Wa of the memory transistor 35a. The configurations in the embodiment other than the foregoing are the same as those of the first embodiment.

The operation and effect of the embodiment will be described below.

FIG. 10 illustrates an example of the pattern of data stored in one memory cell in the embodiment.

FIG. 11 illustrates an example of the relationship between the combination of the state of two memory transistors belonging to one memory cell and the memory cell value according to the embodiment.

The method of notation used in FIG. 10 is the same that in FIG. 7, and the method of notation used in FIG. 11 is the same that in FIG. 8.

In the embodiment, since the channel width Wb of the memory transistor 35b is three times that of the channel Wa of the memory transistor 35a, the drain current of the memory transistor 35b is three times that of the drain current of the memory transistor 35a. In other words, when the dimension of the drain current produced when only the memory transistor 35a is in the ON position is taken to have a value of 1, the dimension of the drain current produced when only the memory transistor 35b is in the ON position has a value of 3. The dimension of the drain current produced when each of the memory transistors 35a and 35b are in the ON position has a value of 4 (=1+3). Thus, when the current amount of the U-shaped pillar 30 is measured, in a memory cell that is being read, it is possible to discriminate between whether only the memory transistor 35a is in the ON position, whether only the memory transistor 35b is in the ON position, or whether each of the memory transistors 35a and 35b are in the ON position.

As a result, as illustrated in FIG. 10 and FIG. 11, in the embodiment, in contrast to the first embodiment, it is possible to discriminate between the two situations in which one of the pair of memory transistors is in the ON position and the other is in the OFF position, and thereby it is possible to store 24 values in one memory cell. Thus, a greater number of values can be stored in comparison to the first embodiment.

In the embodiment, the number of values that can be stored in one memory cell is generally expressed as described below. When the number of control gate electrodes facing one silicon pillar in one memory cell is taken to be n, and the number of values that can be stored in each memory transistor is taken to be m, the number M of storable values in one memory cell is expressed by formula (I) below.

$$M = m^n + m \times n \tag{1}$$

In the embodiment, since n=2 and m=4, $M=4^2+4\times2=24$.

Other aspects of operation and effect in the embodiment are the same as those described in the first embodiment.

In the embodiment, although an example has been described in which there are three levels of reading potentials, the number of reading potentials may have four levels. In other words, a reading potential $V_{read4}$ may be provided so that a drain current that is higher than the reading potential $V_{read3}$ is produced notwithstanding the stored values. Thus, when the reading potential $V_{read4}$ is applied only to one of the control gate electrodes CG, it is possible to discriminate which of the memory transistors is in the ON position by measuring the dimension of the drain current without reference to information related to the use value of the control gate electrode (refer to FIG. 10(b)). For example, the value "1" and the value "5" in the memory cell illustrated in FIG. 10 can be discriminated.

A variation of the second embodiment will be described below.

Figure 12:
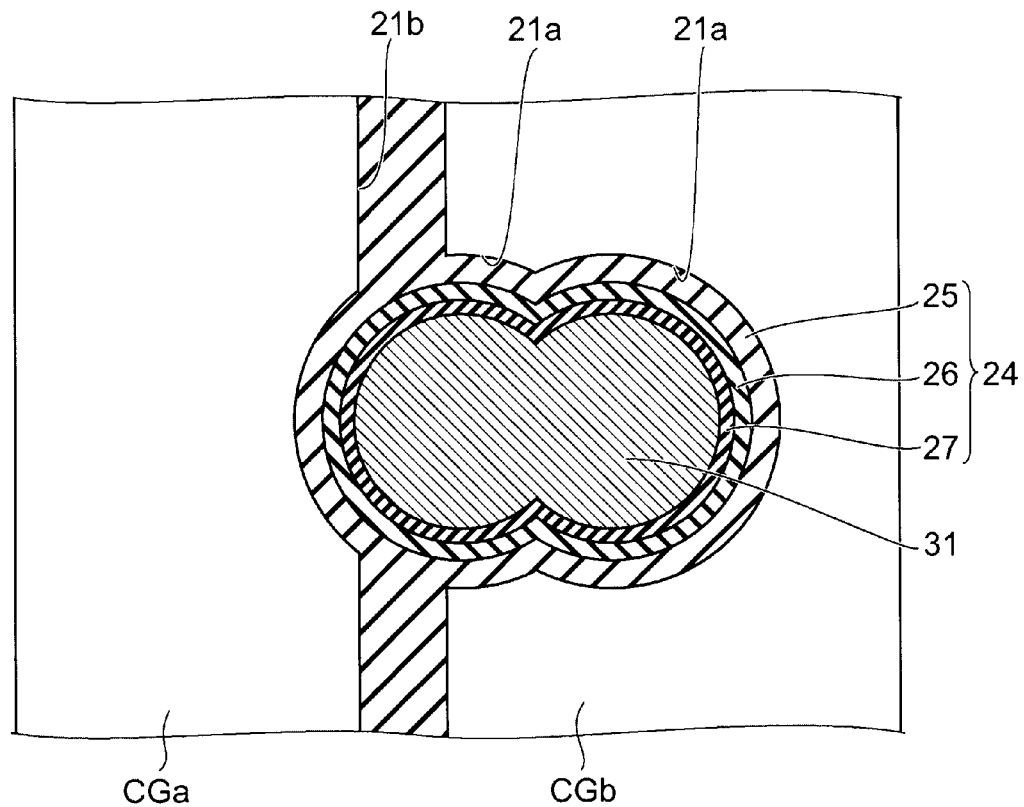
FIG. 12 is a cross-sectional view illustrating a control gate electrode and a silicon pillar in a non-volatile semiconductor memory device according to a variation of the second embodiment.

FIG. 12 is a cross-sectional view illustrating an example of a control gate electrode and a silicon pillar in a non-volatile semiconductor memory device according to the variation.

As illustrated in FIG. 12, in the variation, another through-hole 21a is additionally formed at the same time in an adjacent region along the Y direction seen from the round through-hole 21a configuring the penetrating trench 21, and the memory film 24 and the silicon pillar 31 are formed therein. Thus, the channel width of the memory transistor 35a is considerably different from the channel width of the memory transistor 35b, and therefore the difference in the current amount of the drain currents can be increased. As a result, data reading is facilitated, and operational reliability is further improved. Other aspects of the configuration, operation and effect of the variation are the same as the second embodiment.

A third embodiment of the invention will be described below.

Figure 13:
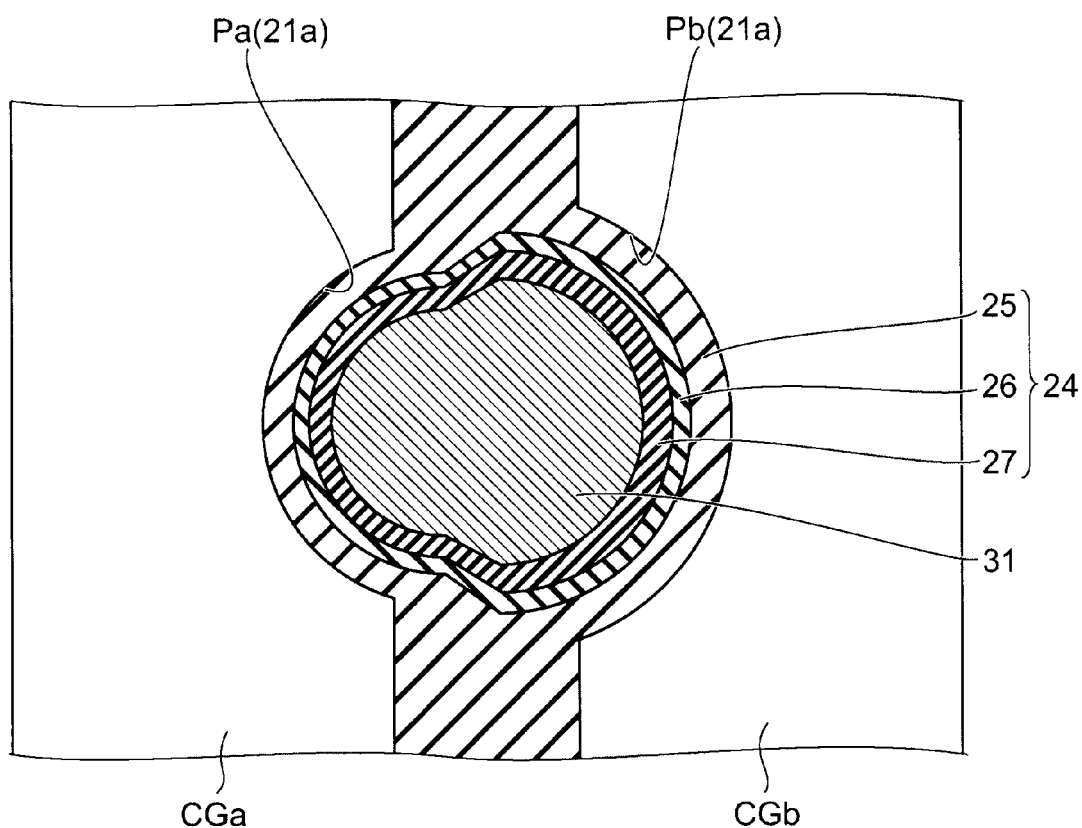
FIG. 13 is a cross-sectional view illustrating a control gate electrode and a silicon pillar in a non-volatile semiconductor memory device according to a third embodiment.

FIG. 13 is a cross-sectional view illustrating an example of a control gate electrode and a silicon pillar in a non-volatile semiconductor memory device according to the embodiment.

Figure 14A:
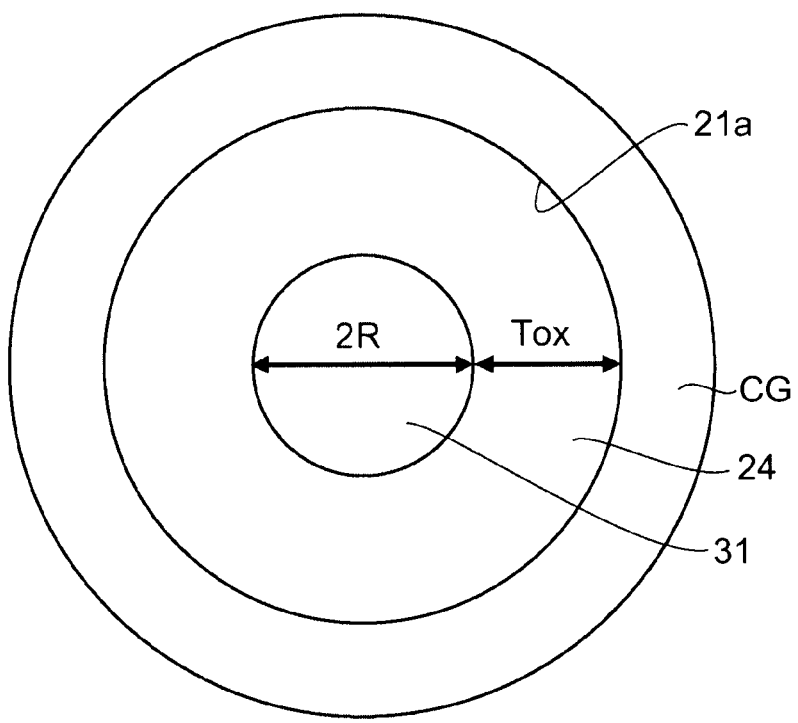
FIG. 14A is a schematic cross-sectional view illustrating an inner portion of the through-hole.
Figure 14B:
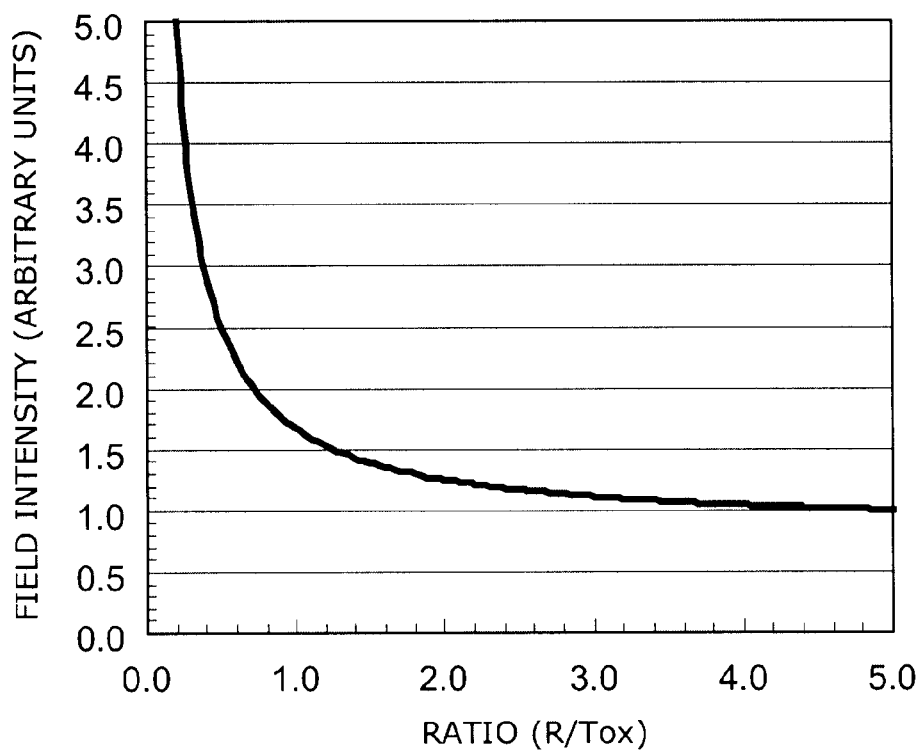
FIG. 14B is a graph illustrating the effect of the silicon pillar radius on the field intensity.

FIG. 14A is a schematic cross-sectional view illustrating an example of an inner portion of the through-hole, and FIG. 14B is a graph illustrating an example of the effect of the silicon pillar radius on the field intensity in which a value of the silicon pillar radius (R) relative to the film thickness (Tox) of the memory film is illustrated on the horizontal axis, and the field intensity on the silicon pillar surface is illustrated on the vertical axis.

In FIG. 14A, the slits 21b and the like are omitted from the figure. The units on the vertical axis in FIG. 14B are values relative to a field intensity having a value of 1 when the radius R is infinitely large.

As illustrated in FIG. 13, the shape of the through-hole, the memory film, and the silicon pillar in the embodiment is different from that in the first embodiment above. In other words, of the end edges of the through-holes 21a in the XY plane, the radius of curvature of the portion Pb formed on the control gate electrode CGb is greater than the radius of curvature of the portion Pa formed on the control gate electrode CGa. The shape of the outer edge of the silicon pillar 31 in addition to the shape of the blocking layer 25, the charge storage layer 26 and the tunneling layer 27 also reflect the shape of the through-hole 21a, and the radius of curvature on the control gate electrode CGb side is greater than the radius of curvature on the control gate electrode CGa side.

For example, when multiple non-volatile semiconductor memory devices are formed on one silicon wafer, the intensity of plasma etching for forming the penetrating trenches 21 in the devices formed in the central portion of the silicon wafer is symmetrical along the Z axis, and the through-hole 21a is formed with an approximately circular shape seen from the Z axis. The intensity of plasma etching in the devices formed in the peripheral portion of the silicon wafer is asymmetrical to the Z-axis. As a result, a though-hole 21a may be formed with a shape as illustrated in FIG. 13.

FIG. 14B illustrates the intensity of the electrical field on the surface of the silicon pillar when a prescribed voltage is applied between the silicon pillar and the control gate electrode. As illustrated in FIG. 14A and FIG. 14B, when the film thickness Tax of the insulating memory film 24 is prescribed, the intensity of the electrical field applied to the surface of the silicon pillar 31 and the memory film 24 increases as the radius R of the silicon pillar 31 reduces. Therefore, even when the same programming potential is applied to the control gate electrode CGa and CGb, the electrical field applied to the charge storage layer 26 is weaker on the control gate electrode CGb side that has a larger radius of curvature in the through-hole 21a and a silicon pillar 31, and the charge amount stored in the memory transistor 35b is still lower. The same comments apply to the reading potential in relation to the control gate electrode CGa and CGb. Even when the same reading potential is applied, the electrical field applied to the charge storage layer 26 on the control gate electrode CGb side is weaker than that on the control gate electrode CGa side.

In the embodiment, even when a reading potential and a programming potential of the same level is applied, the potential applied to the control gate electrode CGb is larger than that applied to the control gate electrode CGa. Alternately, the supply time of the potential to the control gate electrode CGb is longer than the supply time of the potential to the control gate electrode CGa. Thus, the operation of the memory transistor 35a can coincide with the operation of the memory transistor 35b, and driving can be executed in the same manner in the first embodiment or in the second embodiment. Other aspects of the configuration in the embodiment are the same as the first embodiment.

A fourth embodiment of the invention will be described below.

Figure 15:
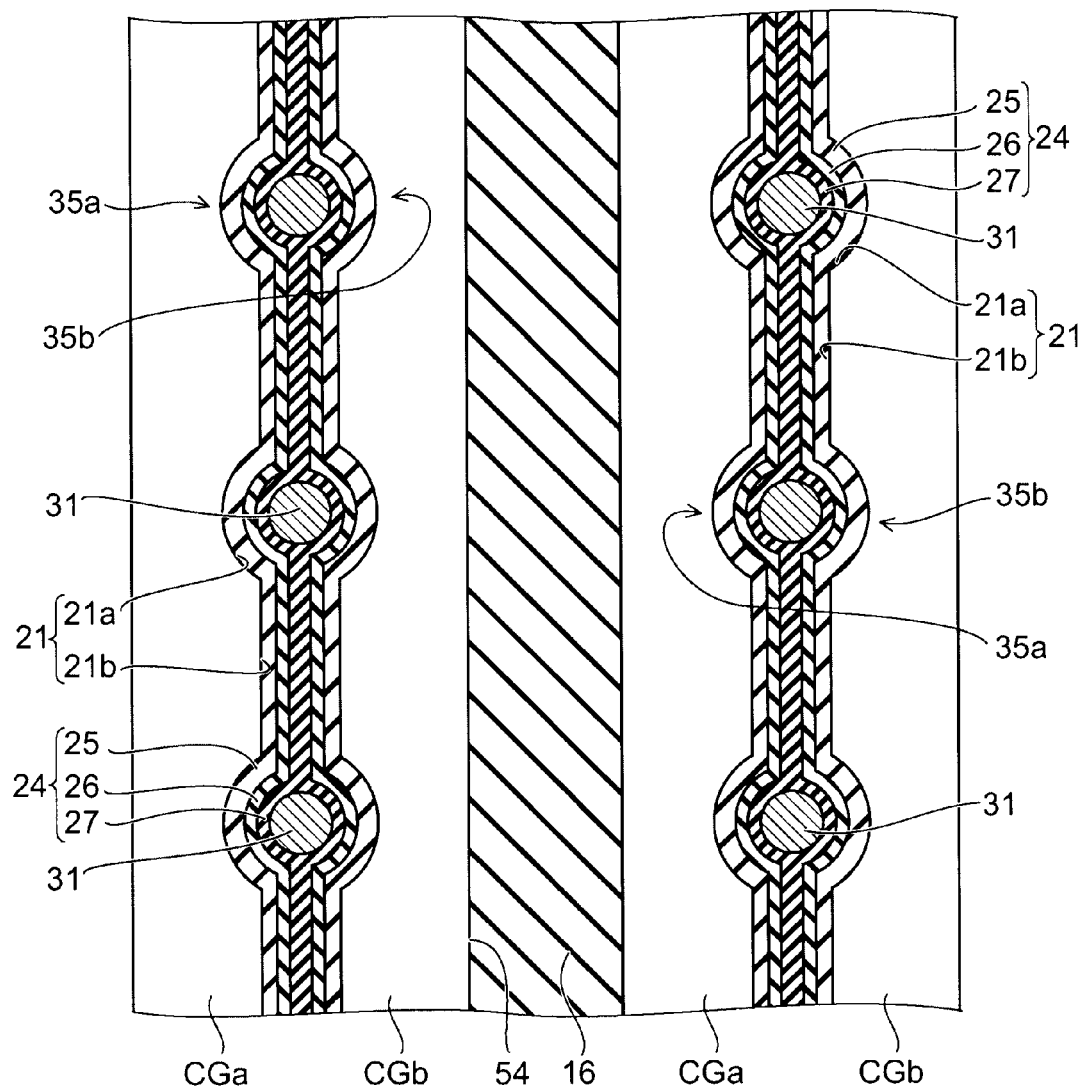
FIG. 15 is a cross-sectional view illustrating a control gate electrode and a silicon pillar in a non-volatile semiconductor memory device according to a fourth embodiment.

FIG. 15 is a cross-sectional view illustrating an example of a control gate electrode and a silicon pillar in a non-volatile semiconductor memory device according to the embodiment.

As illustrated in FIG. 15, in the embodiment, in comparison to the first embodiment, the slit 21b in the penetrating trench 21 is configured with a large width, and the charge storage layer 26 and the tunneling layer 27 protrude into an inner portion of the slit 21b in addition to the blocking layer 25 and thereby extend across the entire length of the penetrating trench 21 along the X direction. As a result, the charge storage layer 26 disposed on the control gate electrode CGa and the charge storage layer 26 disposed on the control gate electrode CGb do not come into mutual contact in one penetrating trench 21. That is to say, in the XY plane, the charge storage layer 26 is divided at each control gate electrode CG. Other aspects of the configuration in the embodiment are the same as the first embodiment.

According to the embodiment, since the charge storage layer 26 is divided between two memory transistors formed in the same level of the same silicon pillar 31, it is possible to prevent a charge stored in the charge storage layer 26 of one memory transistor from passing through the charge storage layer 26, and shift to the charge storage layer 26 of the other memory transistor. As a result, the non-volatile semiconductor memory device according to the embodiment exhibits high data retention reliability. Although the charge storage layer 26 is continuously aligned between adjacent through-holes 21a along the X direction, since the distance between adjacent through-holes 21a is larger than the diameter of the through-hole 21a, there is little possibility that the charge will shift between memory cells. Other aspects of the operation and effect in the embodiment are the same as the first embodiment.

A variation of the fourth embodiment will be described below.

Figure 16:
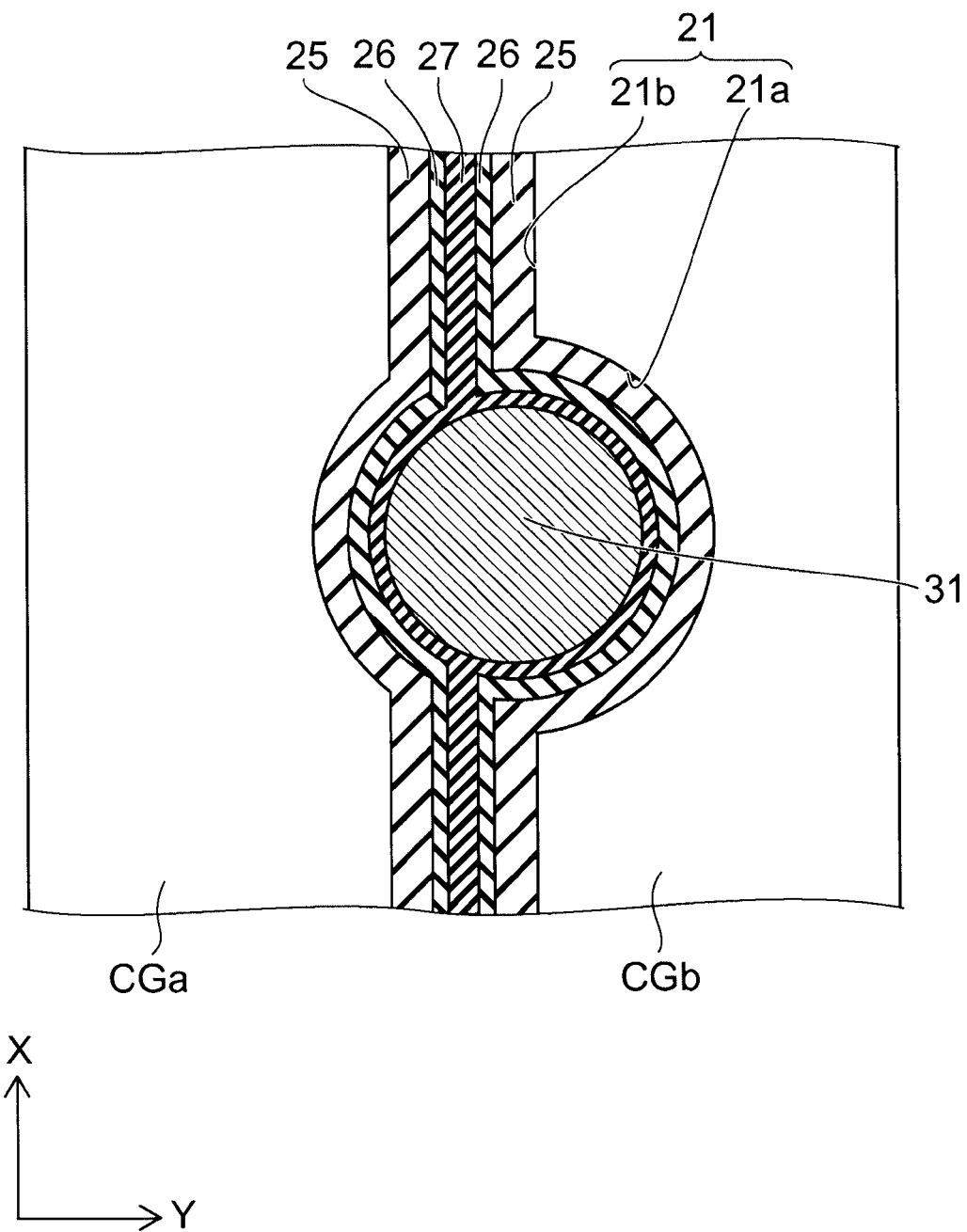
FIG. 16 is a cross-sectional view illustrating a control gate electrode and a silicon pillar in a non-volatile semiconductor memory device according to a variation of the fourth embodiment.

FIG. 16 is a cross-sectional view illustrating an example of a control gate electrode and a silicon pillar in a non-volatile semiconductor memory device according to the variation.

As illustrated in FIG. 16, in the variation, the charge storage layer 26 is divided at each control gate electrode in the same manner as the fourth embodiment in a non-volatile semiconductor memory device in which the channel width is configured asymmetrically in the same manner as the second embodiment. Thus, both the effect of storing a large number of values in the memory cell and the effect of preventing shift of the charge stored in the charge storage layer 26 are enabled. Other aspects of the configuration, the operation and the effect in the variation are the same as the fourth embodiment.

In the fourth embodiment and the variation of the fourth embodiment, although an example has been described in which the charge storage layer 26 on the memory transistor 35a side is completely separated from the charge storage layer 26 on the memory transistor 35b, each of the layers may be connected at the position of separation from the silicon pillar 31. For example, charge transfer can be effectively suppressed even when the layers are connected as long as the portion that is used is sub-divided by a distance of at least half the radius of the silicon pillar 31 from the portion enclosing the silicon pillar 31 in the charge storage layer 26.

A fifth embodiment of the invention will be described below.

The embodiment is a method for manufacturing the non-volatile semiconductor memory device according to the first embodiment.

FIG. 17A to FIG. 25B illustrate examples of the method for manufacturing the non-volatile semiconductor memory device according to the embodiment. In each figure, A is a plan view of processes, and B in each figure is a cross-sectional view of processes along the line A-A' illustrated in A.

Figure 17A:
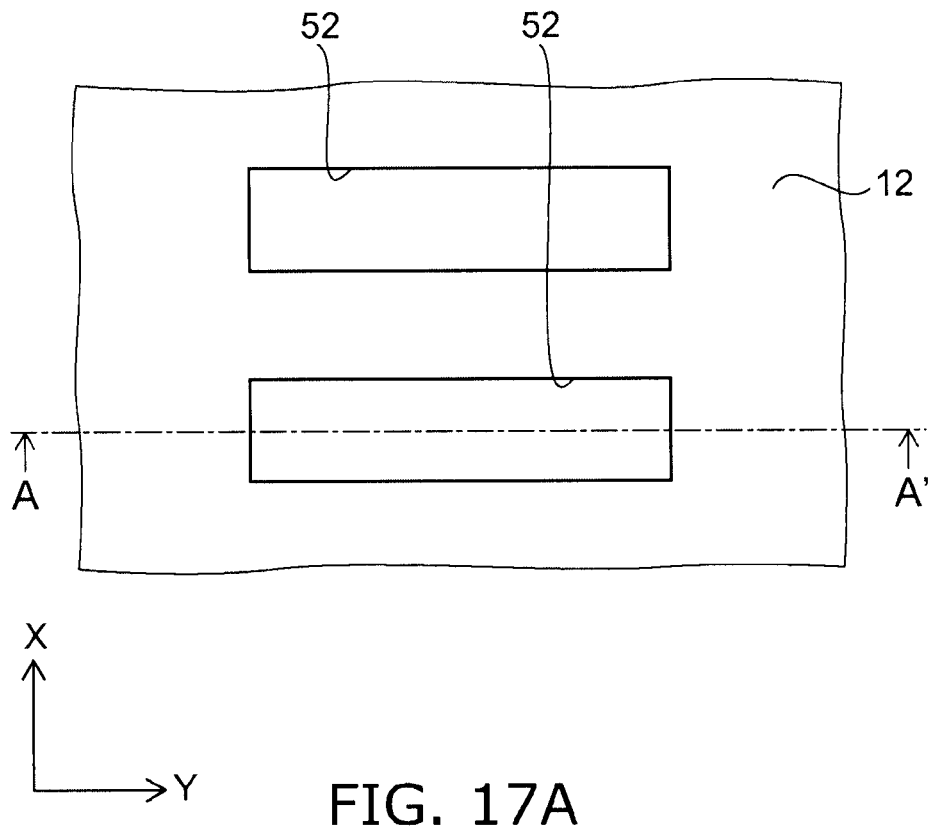
FIG. 17A to FIG. 25B illustrate a method for manufacturing a non-volatile semiconductor memory device according to a fifth embodiment.
Figure 17B:
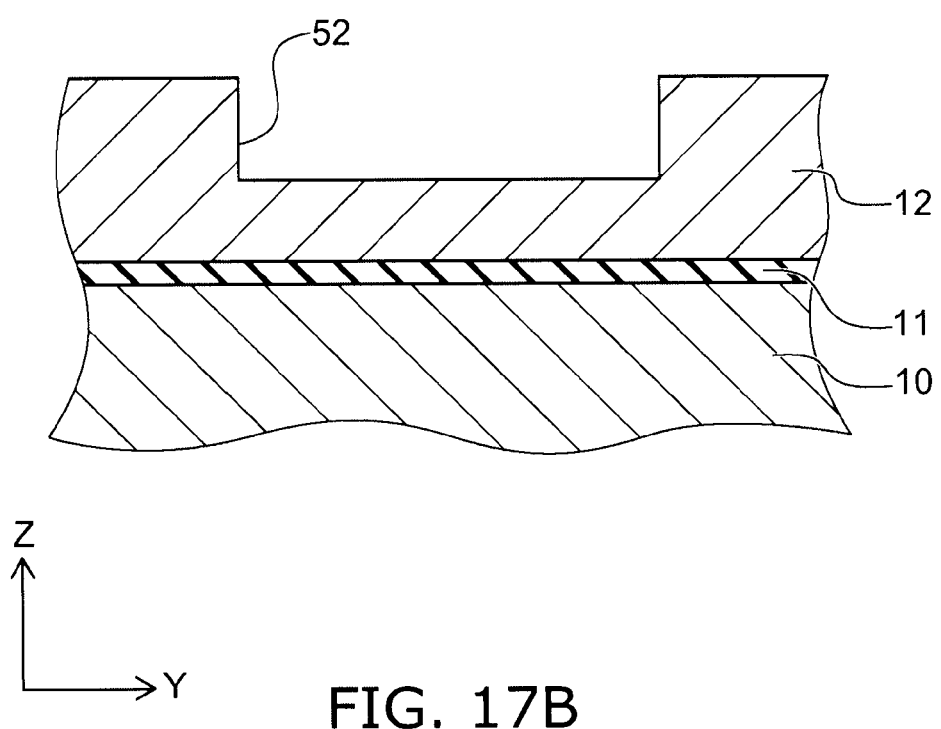

As illustrated in FIGS. 17A and 17B, firstly, a silicon substrate 10 is prepared. A memory cell region is set in the silicon substrate 10, and a peripheral circuit region (not illustrated) is set on the periphery of the memory cell region. A gate insulating film is formed on the silicon substrate 10 in the peripheral circuit region, and an insulating film 11 is formed on the silicon substrate 10 in the memory cell region. Then, a polysilicon film 12 is deposited on the insulating film 11. In the memory cell region, photolithography and RIE (reactive ion etching) are performed on the upper layer portion of the polysilicon film 12 to form multiple trenches 52 having rectangular configurations extending in the Y direction on the upper surface of the polysilicon film 12. The trenches 52 are aligned along the X direction and the Y direction in a matrix configuration. The trenches 52 are recesses made in the upper surface of the polysilicon film 12.

Figure 18A:
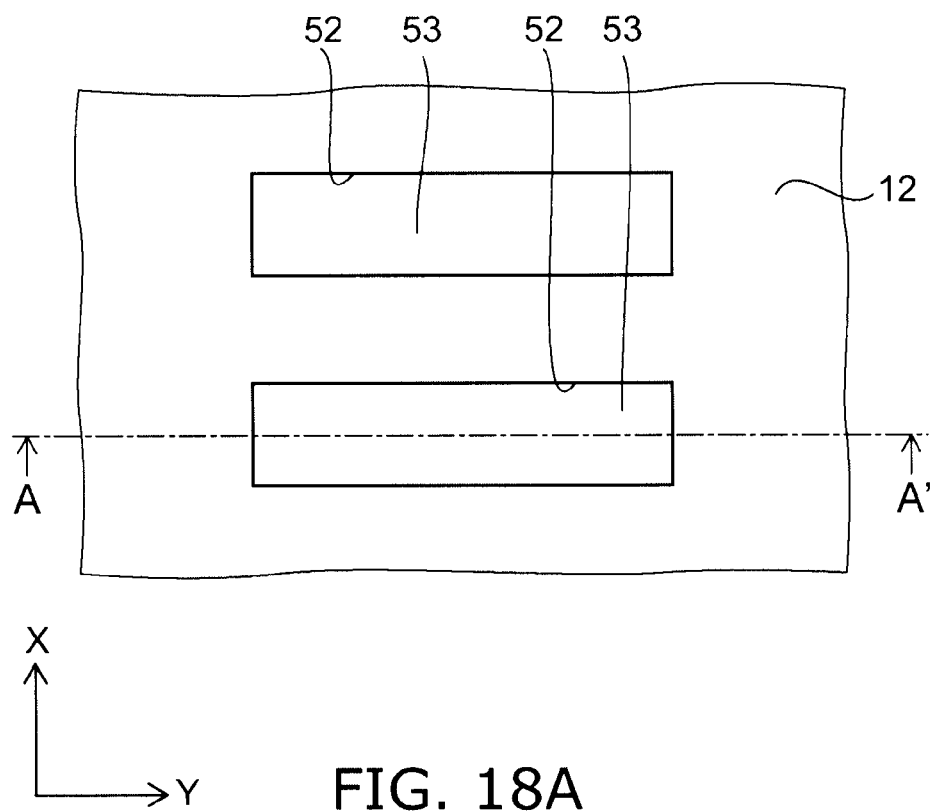
Figure 18B:
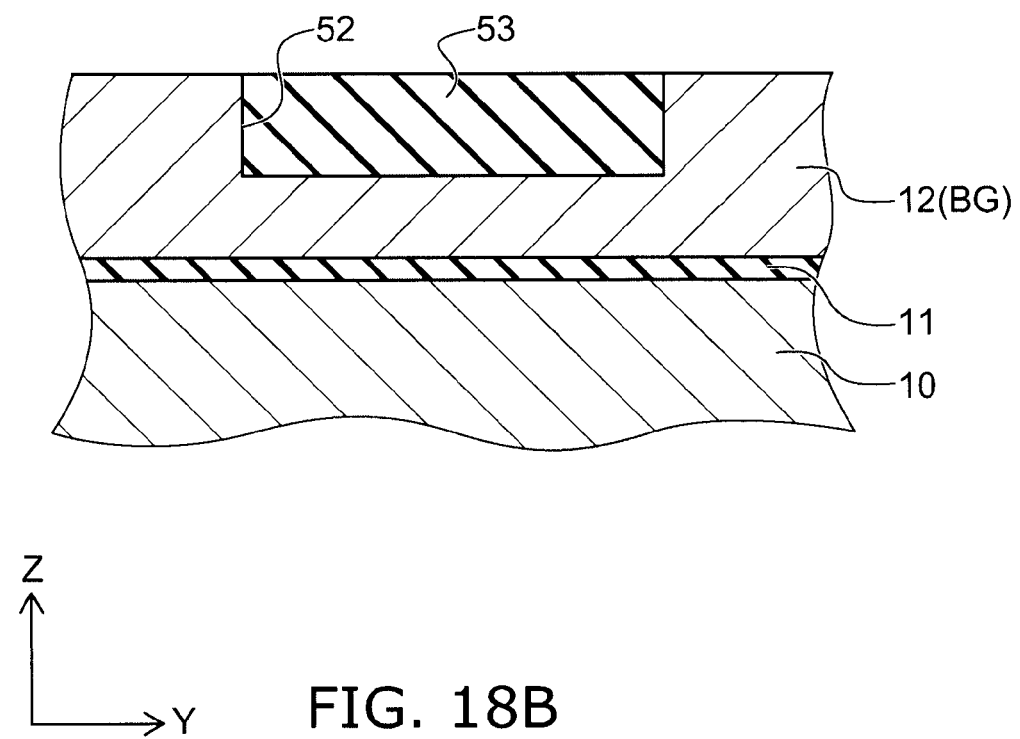

Next, as illustrated in FIGS. 18A and 18B, a silicon nitride film is deposited using a CVD method (chemical vapor deposition method) to form a sacrificial layer 53 on the polysilicon film 12. At this time, the sacrificial layer 53 is filled into the trenches 52. Next, the sacrificial film 53 and the polysilicon film 12 are patterned by, for example, photolithography and RIE. Thus, a flat back gate electrode BG is formed from a polysilicon film 12 in the memory cell region, and a gate electrode is formed from the polysilicon film 12 in the peripheral circuit region. Next, the sacrificial film 53 is recessed, removed from on top of the polysilicon layer 12 and left only in an inner portion of the trench 52.

Figure 19A:
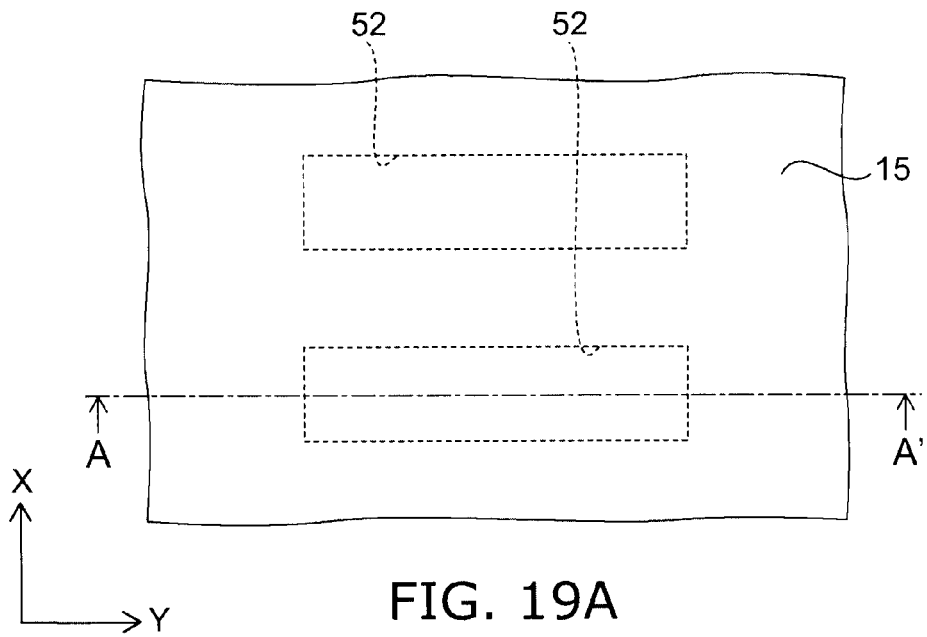
Figure 19B:
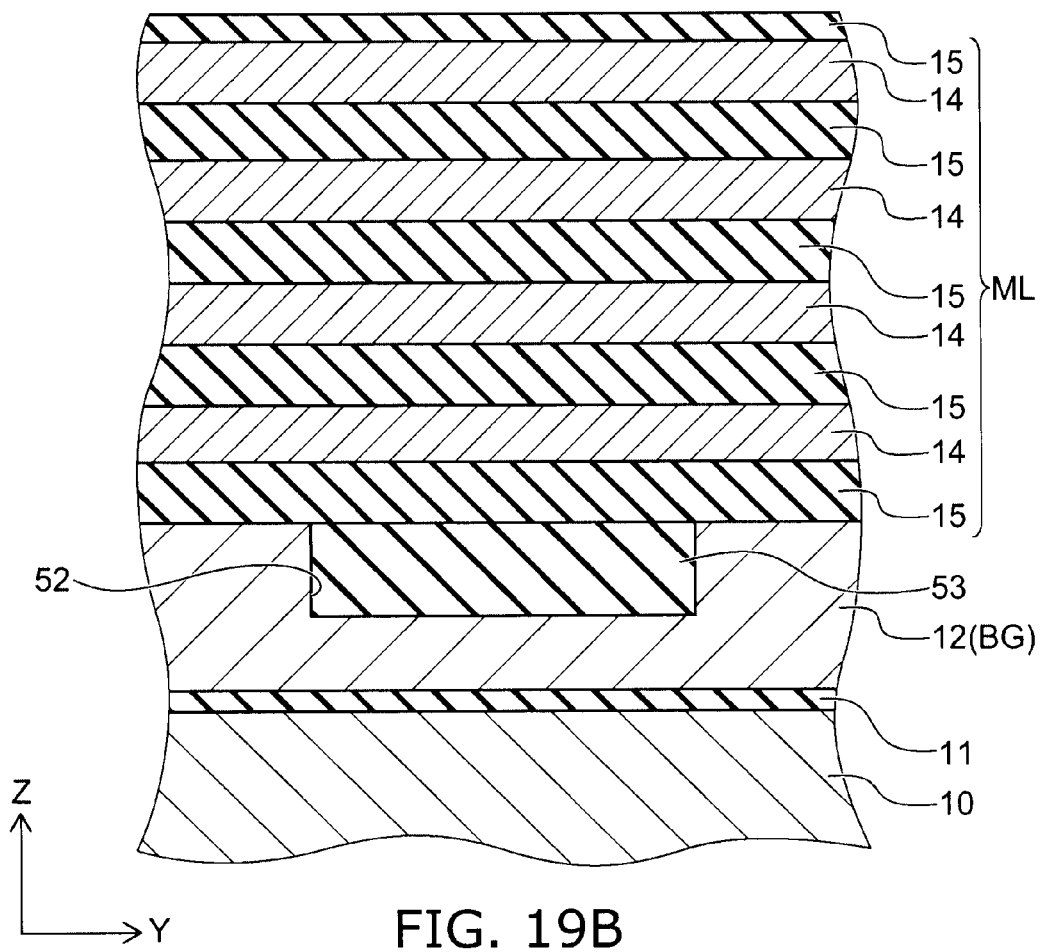

Continuing as illustrated in FIGS. 19A and 19B, the insulating films 15 made of, for example, silicon oxide are deposited alternately with the electrode films 14 made of, for example, polysilicon on the back gate electrode BG in the memory cell region to form the stacked body ML. In the manufacturing method to this point, the manufacturing processes for any of the non-volatile semiconductor memory devices according to the first to the fourth embodiments are common.

Figure 20A:
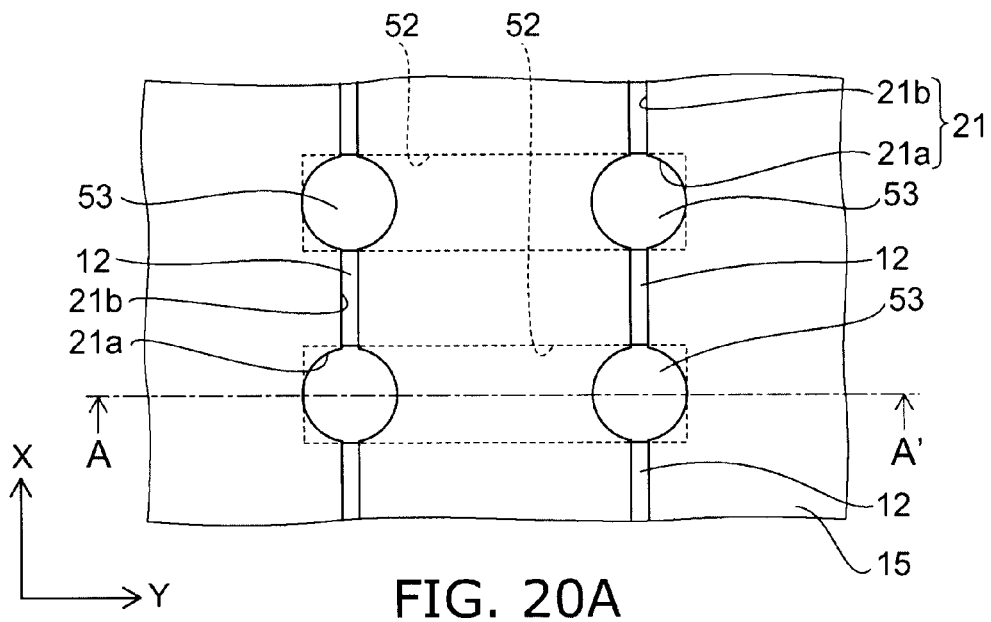
Figure 20B:
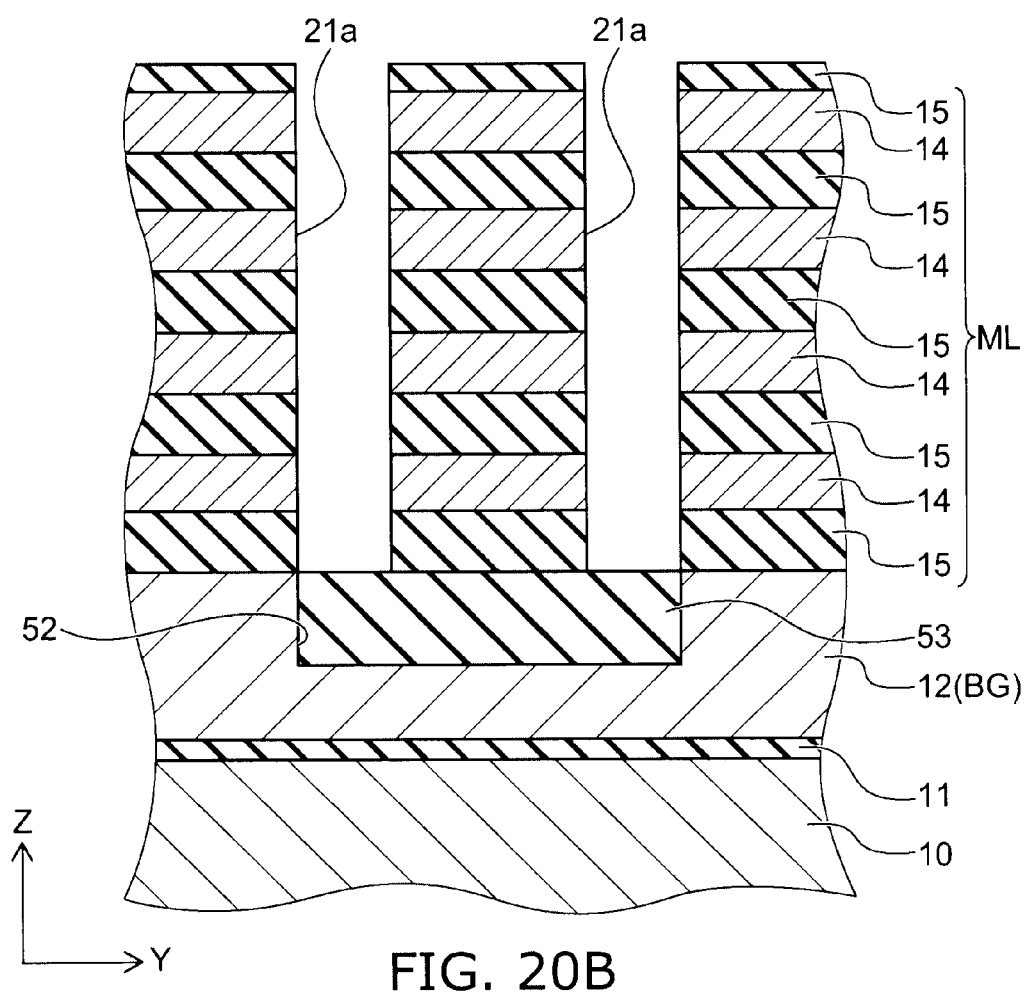

The, as illustrated in FIGS. 20A and 20B, the multiple through-holes 21 are collectively formed in the stacked body ML by, for example, RIE to extend along the X direction and the Z direction. The penetrating trenches 21 are configured from through-holes 21a that are aligned along the X direction and the Y direction in a matrix configuration, and slits 21b that communicate the through-holes 21a aligned along the X direction. The bottom portions of the through-holes 21a reach both ends of the sacrificial film 53 filled in the trenches 52. Thus, two through-holes 21a adjacent to each other along the Y direction reach each of the sacrificial film 53. When manufacturing a non-volatile semiconductor memory device according to the first embodiment, the central axis of the through-hole 21a is positioned on the central line of the slit 21b. When manufacturing a non-volatile semiconductor memory device according to the second embodiment, the central axis of the through-hole 21a is positioned at a position separated from the central line of the slit 21b. Furthermore, when manufacturing a non-volatile semiconductor memory device according to the fourth embodiment, the width of the slit 21b is larger than in the case of manufacturing the device according to the first embodiment.

Figure 21A:
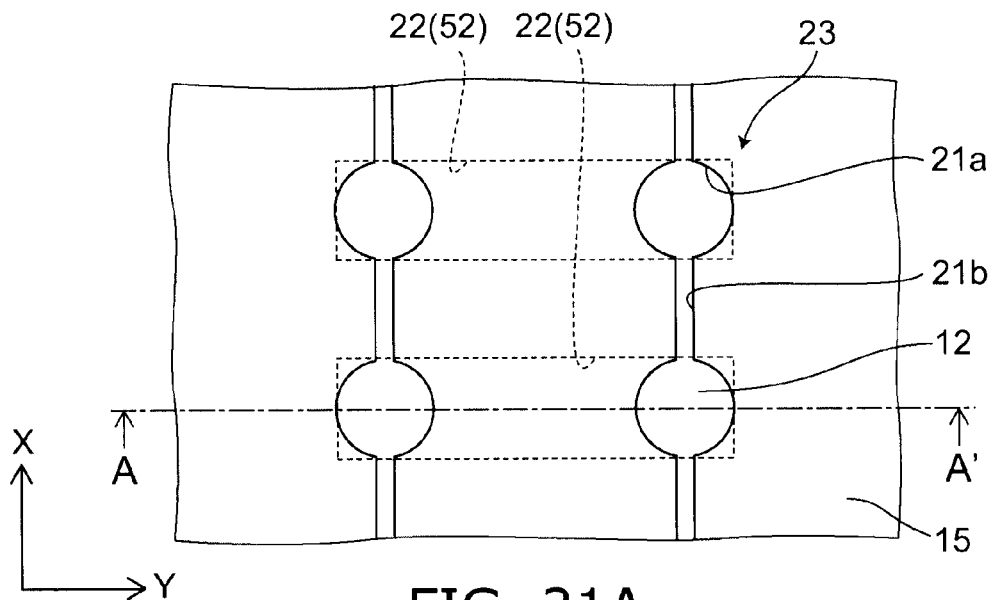
Figure 21B:
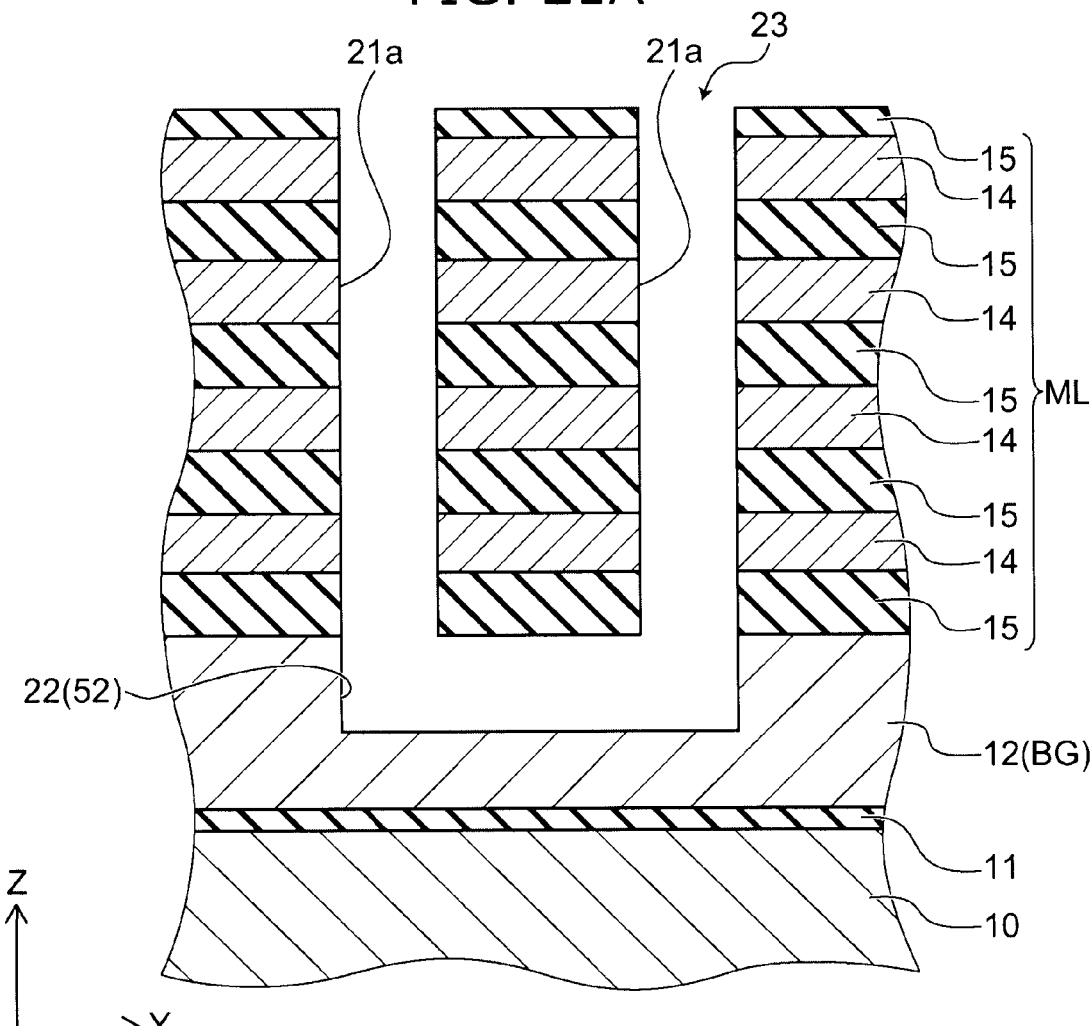

As illustrated in FIGS. 21A and 21B, wet etching is executed via the through-hole 21a to remove the sacrificial film 53 in the trench 52 (refer to FIG. 17B). Thus, the trench 52 forms a communicating hole 22. The communicating hole 22 and the two through-holes 21a communicated with both ends of the communicating hole 22 form one communicated U-shaped hole 23.

Figure 22A:
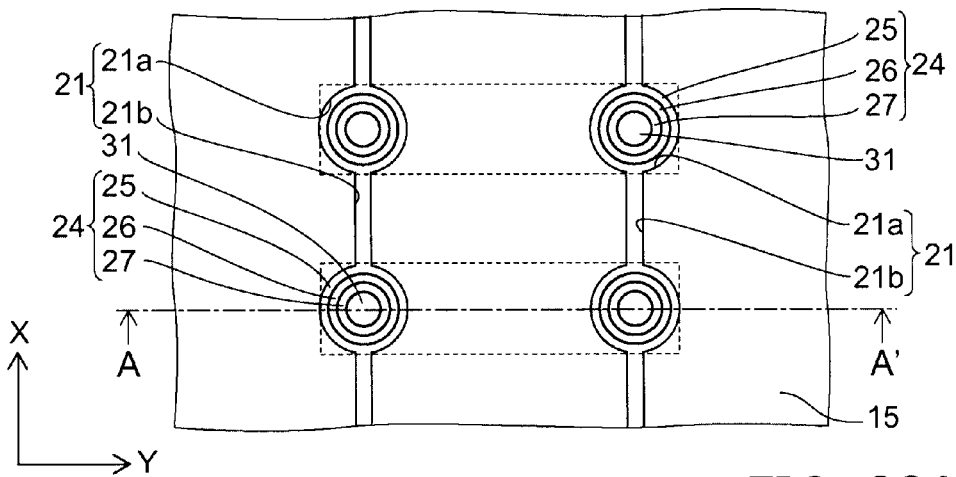
Figure 22B:
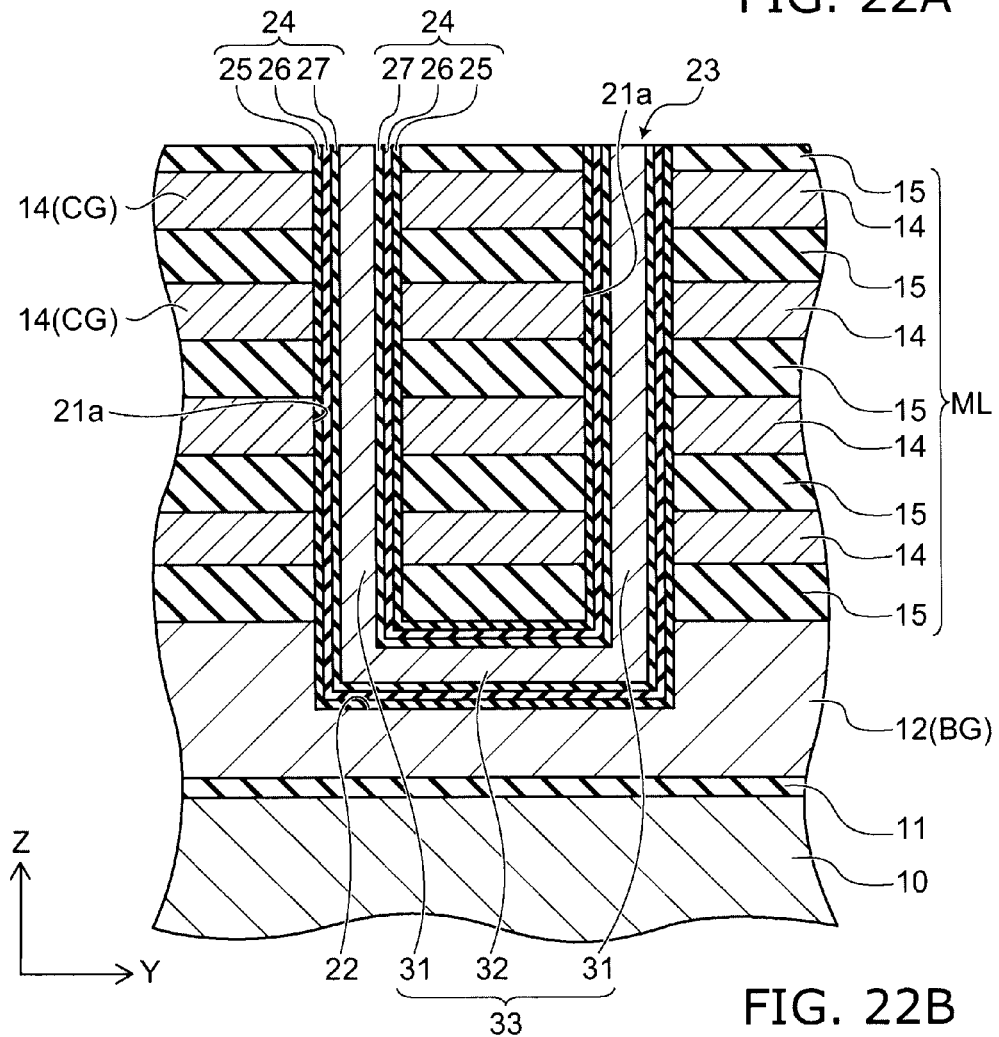

Next, as illustrated in FIGS. 22A and 22B, a blocking layer 25 is formed on an inner surface of the U-shaped hole 23 for example by depositing alumina. The blocking layer 25 is such that although the inner portion of the slit 21b is completely buried, the inner portion of the though-hole 21a is not buried. When manufacturing a device according to the fourth embodiment, the blocking layer 25 is adapted so that the inner portion of the slit 21b is also not completely buried. Then, the charge storage layer 26 is formed on the blocking layer 25 by depositing a silicon nitride compound for example. Since the blocking layer 25 is already buried into the slit 21b, the charge storage layer 26 is formed in a pipe-shape only in the U-shaped hole 23.

Next, a tunneling film 27 is formed on the charge storage layer 26 by depositing a silicon oxide for example. The tunneling film 27 is also formed in a pipe-shape only in the U-shaped hole 23. The memory film 24 is formed of the blocking layer 25, the charge storage layer 26, and the tunneling layer 27. When manufacturing the device according to the fourth embodiment, the charge storage layer 26 and the tunneling layer 27 are also formed in the slit 21b, and the interior slit is buried with the blocking layer 25, the charge storage layer 26, and the tunneling layer 27. Thus, the charge storage layer 26 formed in one through-hole 21a is divided at each control gate electrode CG by the tunneling layer 27.

Subsequent processes are common in the first to the fourth embodiments. In other words, amorphous silicon is filled into the interior of the U-shaped hole 23 by depositing amorphous silicon on the whole surface. The U-shaped silicon member 33 is configured from a pair of silicon pillars 31 buried in the through-hole 21 and one connecting member 32 buried in the connecting hole 22. Thereafter, the amorphous silicon, the silicon oxide film, the silicon nitride film, and the silicon oxide film that have been deposited on the stacked body ML are removed.

Figure 23A:
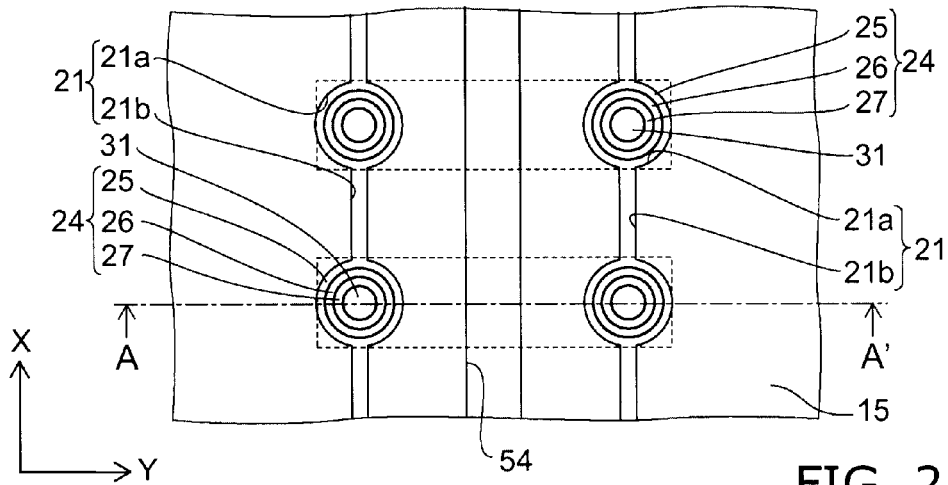
Figure 23B:
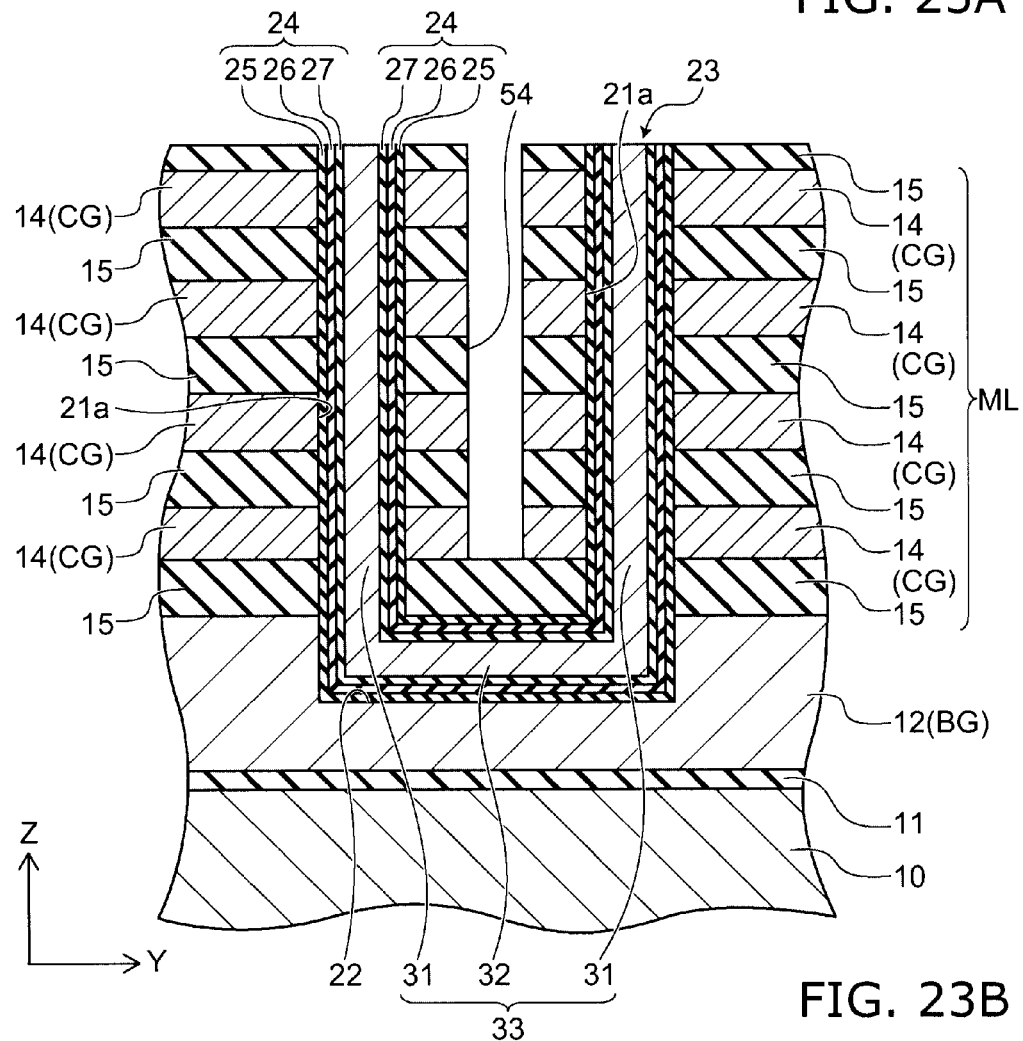

Next, as illustrated in FIGS. 23A and 23B, the stacked body ML is processed using RIE to form a trench 54 on the stacked body ML. The trench 54 is formed to reach the lowermost insulating layer 15. As illustrated in FIG. 4, the trench 54 is formed so that the electrode layer 14 is divided into a pair of mutually meshed comb-shaped patterns. In other words, the trench 54 is formed in a central portion along the X direction of the stacked body ML to extend along the X direction and connect the regions between the silicon pillars 31 aligned along the Y direction. The electrode film 14 is divided into multiple control gate electrodes CG aligned along the X direction by the penetrating trenches 21 and the trenches 54.

Figure 24A:
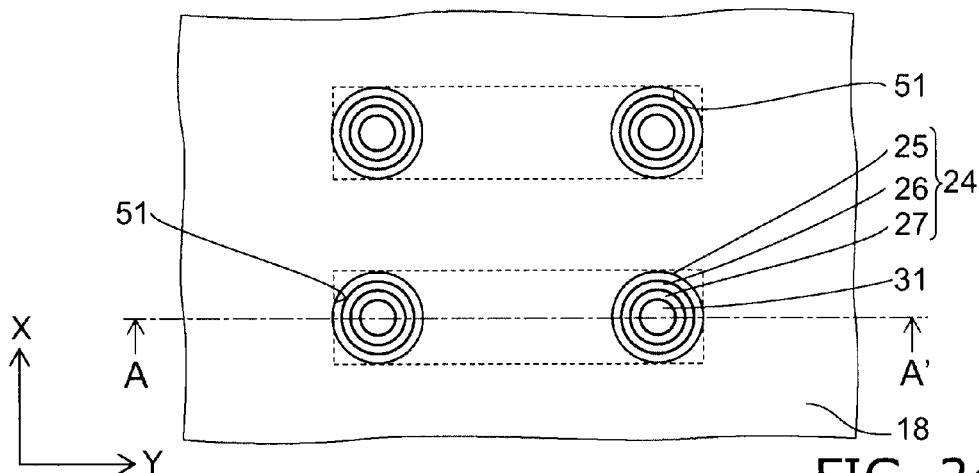
Figure 24B:
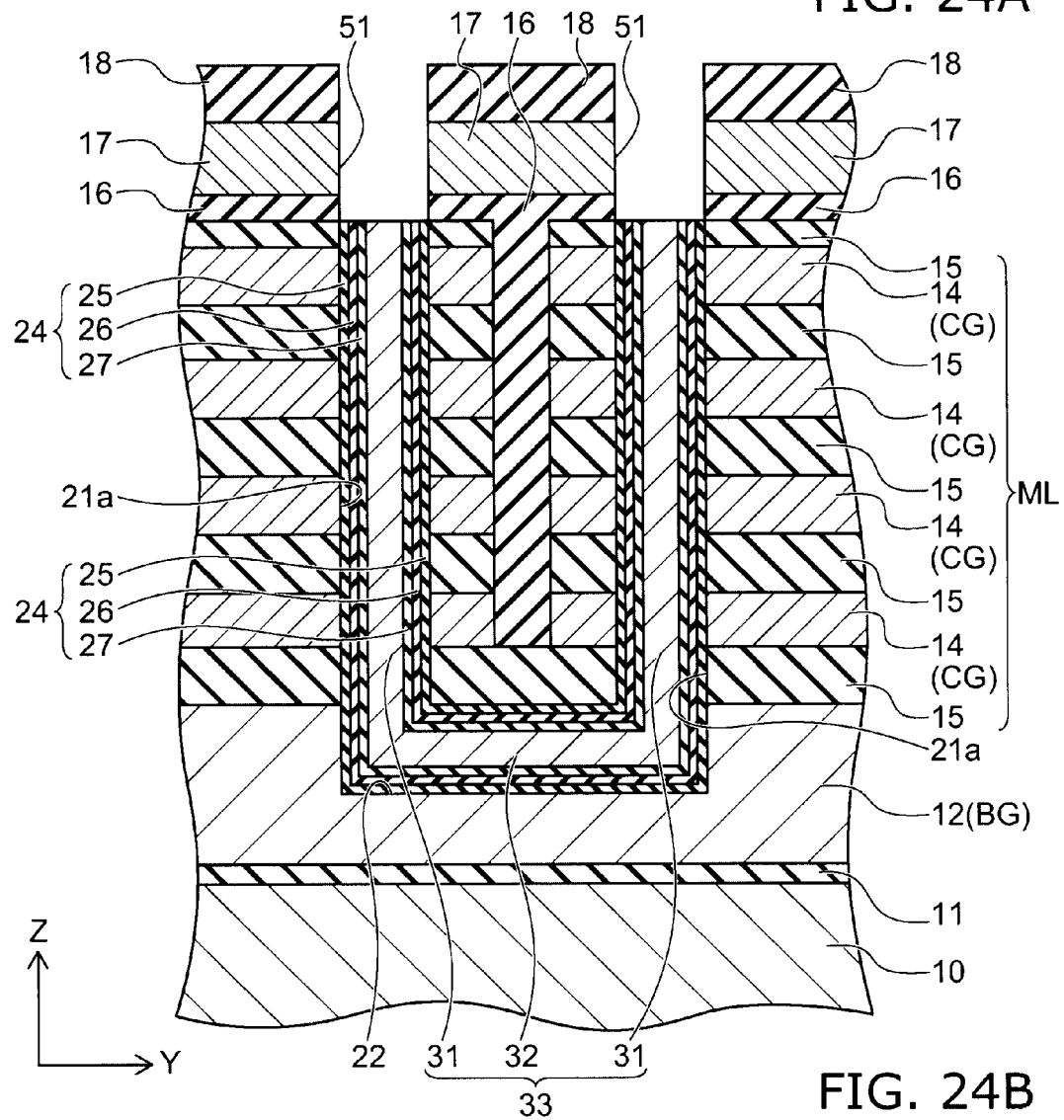

As illustrated in FIGS. 24A and 24B, the insulating film 16 is deposited onto the stacked body ML and planarized. The insulating film 16 is also filled into the trenches 54. Then, the conductive film 17 made of, for example, amorphous silicon is deposited, etched, and left only in the memory cell region. Then, a resist film (not illustrated) is formed, for example, on the conductive film 17; and the stacked body ML is patterned into a stairstep configuration by repeatedly performing etching using the resist film as a mask and performing slimming of the resist film. Thereby, both X-direction end portions of the control gate electrodes CG for each level are not covered with the control gate electrodes CG of the level thereabove as viewed from above (the Z direction). In subsequent processes, contacts can be formed from above to the control gate electrodes CG of each level. Then, an etching stopper film (not illustrated) made of, for example, silicon nitride is formed to cover the stacked body ML patterned into the stairstep configuration, an inter-layer insulating film (not illustrated) is formed thereupon; and the upper surface is planarized. Thereby, the inter-layer insulating film is filled around the stacked body ML. Subsequently, the insulating film 18 is formed on the conductive film 17. The through-holes 51 are formed to pierce the insulating film 18, the conductive film 17, and the insulating film 16 to reach the upper ends of the through-holes 21 in the stacked body ML.

Figure 25A:
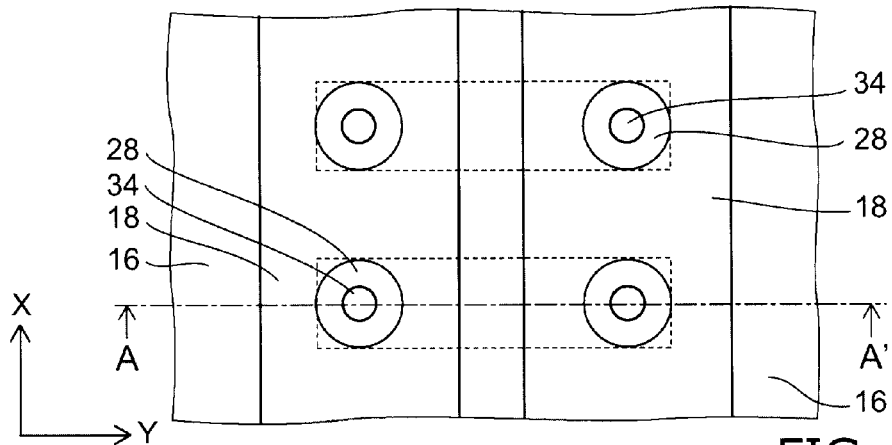
Figure 25B:
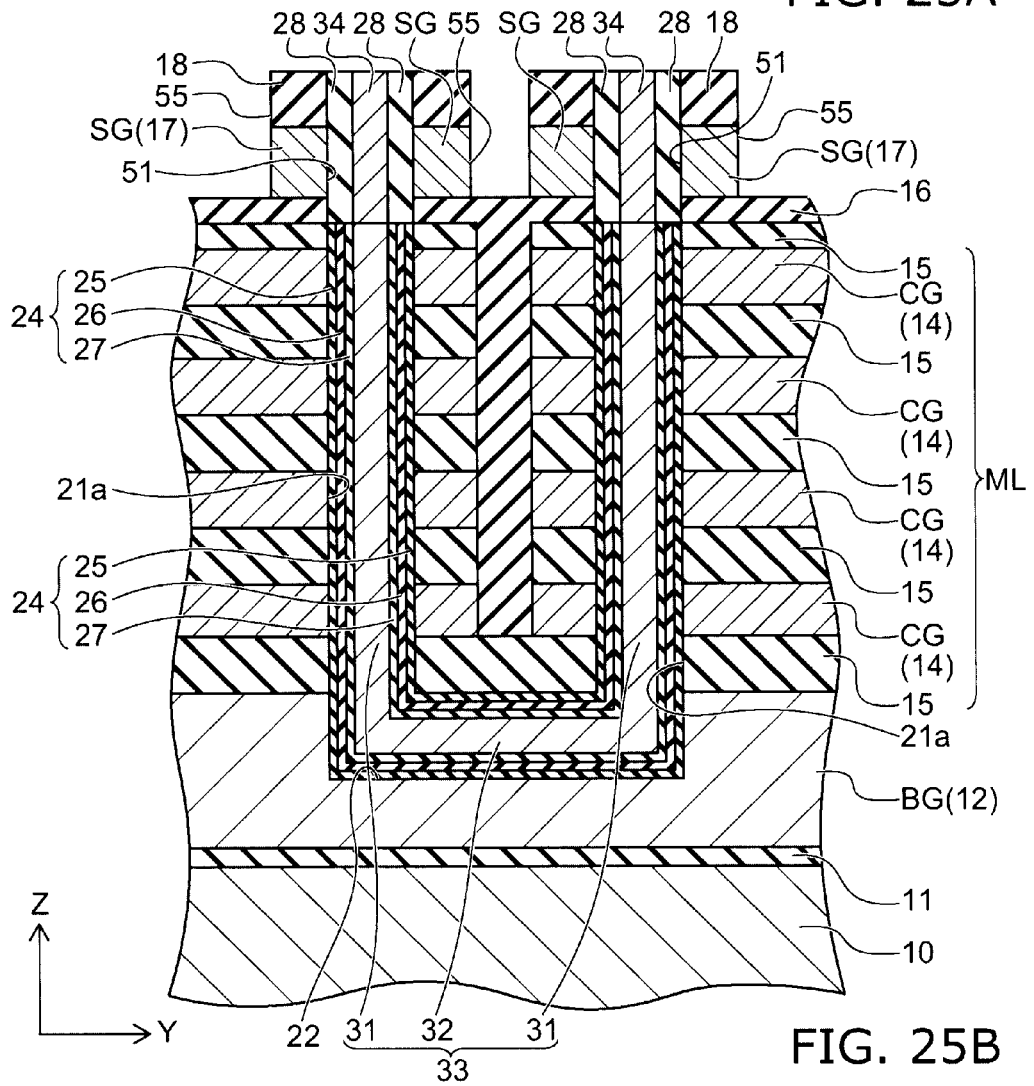

Then, as illustrated in FIGS. 25A and B, an insulating film is deposited on the whole surface, and amorphous silicon is deposited. Etch-back is performed on the amorphous silicon and the insulating film to leave the amorphous silicon and the insulating film only in the through-holes 51. Thereby, the gate insulating film 28 is formed on the inner face of the through-holes 51 and the amorphous silicon is filled. Then, the amorphous silicon is crystallized by thermal processing, and impurities are activated to form a silicon pillar 34 in the through-hole 51. The silicon pillar 34 is connected to the silicon pillar 31. Continuing, patterning by RIE and the like is performed on the insulating film 18 and the conductive film 17 to make trenches 55 extending along the X direction in the regions between the silicon pillars 34 adjacent to each other along the Y direction. Thereby, the conductive film 17 is divided along the Y direction to form multiple selection gate electrodes SG extending along the X direction.

Then, as illustrated in FIG. 2, the insulating film 19 is formed on the insulating film 18, source plugs SP are buried in the insulating film 19, and the source lines SL extending along the X direction are formed on the insulating film 19. At this time, the source lines SL are connected to a part of the silicon pillars 34 via the source plugs SP. Contacts (not illustrated) connected to each of the control gate electrodes CG and each of the selection gate electrodes SG from above are formed in the inter-layer insulating film (not illustrated) provided around the stacked body ML. Then, the insulating film 20 is formed on the insulating film 19 to cover the source lines SL. Then, the bit plugs BP are buried in the insulating films 20 and 19 and the bit lines BL extending along the Y direction are formed on the insulating film 20. At this time, the bit lines BL are connected to the remaining silicon pillars 34 via the bit plugs BP. Thereby, the nonvolatile semiconductor memory device 1 is manufactured.

According to the embodiment, the non-volatile semiconductor memory device according to the first embodiment described above can be manufactured. Furthermore in the processes illustrated in FIGS. 20A and 20B, the patterning of the electrode film 14 is adjusted to enable to manufacture the non-volatile semiconductor memory devices according to the second to the fourth embodiments and the variations described above.

Next, a sixth embodiment will be described.

In the first to the fifth embodiments described above, although a stacked non-volatile semiconductor memory device was illustrated, the embodiment describes a flat non-volatile semiconductor memory device.

Figure 26:
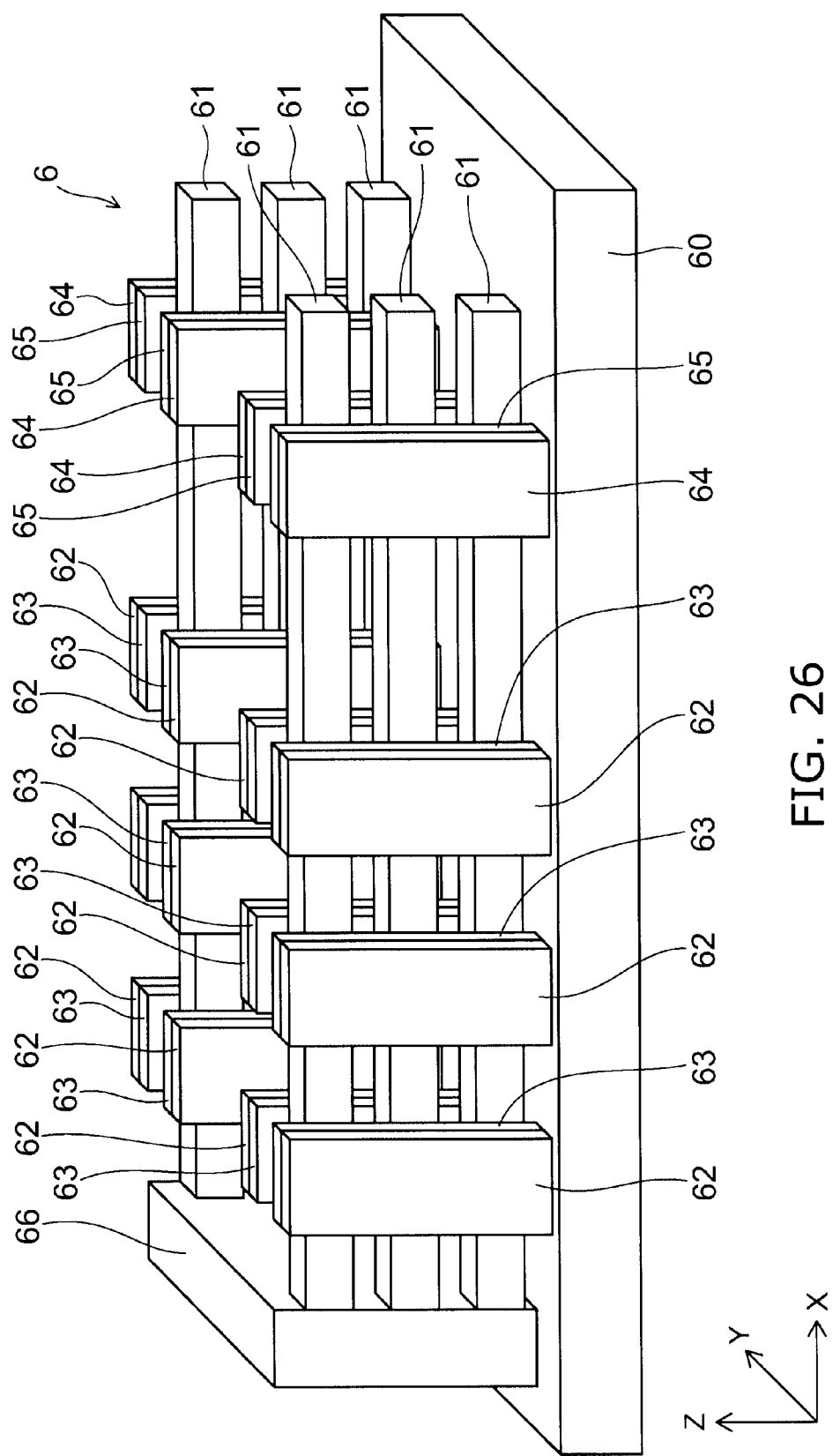
FIG. 26 is a perspective view illustrating a non-volatile semiconductor memory device according to a sixth embodiment.

FIG. 26 is a perspective view illustrating a non-volatile semiconductor memory device according to the embodiment.

As illustrated in FIG. 26, a substrate 60 is provided in the non-volatile semiconductor memory device 6 according to the embodiment. The upper surface of the substrate 60 is defined as the XY plane. Multiple silicon pillars 61 extending along the X direction are provided on the substrate 60. The silicon pillars 61 are provided in parallel, and are aligned along the Y direction and Z direction in a matrix configuration as viewed along the X direction.

Multiple pairs of control gate electrodes 62 are aligned along the X direction on the substrate 60. Each pair of control gate electrodes 62 is disposed to sandwich silicon pillars 61 along the Y direction. Each control gate electrode 62 extends along the Z direction. Multiple groups formed from multiple pairs of control gate electrodes 62 disposed on each of the sides of one silicon pillar 61 and aligned along the X direction are aligned along the Y direction on each silicon pillar 61 aligned along the Y direction.

Furthermore, a memory film 63 is provided between the silicon pillars 61 and the control gate electrodes 62. In the memory film 63, in the same manner as the memory film 24 according to the first embodiment above (refer to FIG. 2), a blocking layer 25, a charge storage layer 26, and a tunneling layer 27 are stacked in order from the control gate electrode 62 side. The memory layer 63 extends along the Z direction together with the control gate electrode 62.

Furthermore, a pair of selection gate electrodes 64 is provided at each group of silicon pillars 61 aligned along the Z direction to sandwich one end of the silicon pillar 61. A gate insulating film 65 is provided between the silicon pillar 61 and the selection gate electrode 64. The selection gate electrode 64 and the gate insulating film 65 extend along the Z direction.

Furthermore, a plate-shaped source electrode 66 is provided on the substrate 60. The major surface of the source electrode 66 configures the YZ plane. The end on the side not sandwiched by the selection gate electrode 64 in the silicon pillar 61 is connected to the source electrode 66 in common.

Operations that are the same as the first embodiment can be also realized in the non-volatile semiconductor memory device 6 according to the embodiment, and the same effect can be obtained. Opposed ends of the source electrode 66 in a pair of silicon pillars 61 adjacent to each other along the Y direction may be mutually connected. The silicon pillar 61, the control gate electrode 62, the memory film 63, and the like may be buried with an insulating material.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments may be practiced in combination with each other.

For example, in each embodiment and variation described above, although the number of values that can be stored in each of the memory transistors is four, the invention is not limited thereto, and 2 values, 3 values, or five or more values may be stored. The number of control gate electrodes facing the silicon pillars in each memory cell is not limited to two, and may be three or more. In each embodiment and variation described above, although an example was described in which a blocking layer 25 or a memory film 24 is interposed between the charge storage layers 26, and the charge storage layers 26 are insulated, the invention is not limited thereto. Since it is sufficient if the charge storage layers 26 are insulated, an air gap may be formed between the charge storage layers 26. In this case, since an air gap has a low dielectric constant, the electric field produced between the charge storage layers 26 is reduced, and charge shift is suppressed. Furthermore, in each embodiment and variation described above, although an example is described in which the insulating film 16 formed from silicon oxide is filled into the trench 54, the invention is not limited thereto, and an air gap may be provided in the trench 54. Since the air gap has a low dielectric constant, the capacitance between the control gate electrodes CG is reduced, and the effect on each of the potentials is reduced. Thus, when reading data from a memory cell, erroneous programming in adjacent memory cells is suppressed, and therefore operational reliability is improved.

In each embodiment and variation described above, although an example has been described in which the nonvolatile semiconductor memory device is a U-shaped device provided with a U-shaped silicon member 33, the invention is not limited thereto, and an I-shaped device may be configured in which a source line is provided in substitution for the back gate electrode BG below the stacked body ML, the upper end of each silicon pillar is connected to the bit line, and the lower end is connected to the source line.

According to the embodiments as described above, a highly integrated non-volatile semiconductor memory device may be realized.

What is claimed is:

1. A nonvolatile semiconductor memory device, comprising:
    a stacked body including a plurality of insulating films alternately stacked with a plurality of electrode films;
    a semiconductor pillar buried in the stacked body, and extending in a stacking direction of the insulating films and the electrode films; and
    a charge storage layer provided between the electrode films and the semiconductor pillar,
    one of the electrode films being divided into a first control gate electrode and a second control gate electrode in a direction perpendicular to the stacking direction, the first control gate electrode and the second control gate electrode sandwiching the semiconductor pillar,
    wherein lengths of each portion facing each of the first control gate electrode and the second control gate electrode on an outer edge of the semiconductor pillar in a section orthogonal to the stacking direction are mutually different,
    wherein a through-hole is formed in the stacked body, the semiconductor pillar being disposed in the through-hole, and
    the first control gate electrode and the second control gate electrode face the semiconductor pillar in the section, and a central axis of the semiconductor pillar is spaced from a straight line connecting the middle points of portions other than portions configuring the through-holes in the end edges opposing each other of the first control gate electrode and the second control gate electrode.

2. The device according to claim 1, wherein the charge storage layer is divided at each of the first control gate electrode and the second control gate electrode in the section that is orthogonal to the stacking direction.

3. The device according to claim 1, wherein a memory transistor having the semiconductor pillar, the charge storage layer, and one of the first control gate electrode and the second control gate electrode can store values of three levels or more.

* * * * *